United States Patent [19]

Yamamoto

[11] Patent Number: 5,317,276

[45] Date of Patent: May 31, 1994

[54] PHASE SHIFTER

[75] Inventor: Kazuya Yamamoto, Itami, Japan

[73] Assignee: Mitsubishi Denki Kabushiki Kaisha, Tokyo, Japan

[21] Appl. No.: 102,428

[22] Filed: Aug. 5, 1993

[30] Foreign Application Priority Data

Aug. 11, 1992 [JP] Japan .................. 4-236557

[51] Int. Cl.⁵ .................. H03K 5/00; H03K 5/13
[52] U.S. Cl. .................. 328/155; 328/55; 307/262
[58] Field of Search .................. 328/55, 155, 57; 307/262, 494, 498; 333/164

[56] References Cited

U.S. PATENT DOCUMENTS

| 3,701,950 | 10/1972 | Seidel | 325/430 |
|---|---|---|---|
| 4,052,679 | 10/1977 | Hosoya | 307/262 |
| 4,638,190 | 1/1987 | Hwang et al. | 328/55 |
| 4,645,946 | 2/1987 | Ishikawa et al. | 307/262 |
| 4,663,594 | 5/1987 | Perkins | 328/155 |
| 4,737,662 | 4/1988 | Oda et al. | 328/155 |
| 4,833,340 | 5/1989 | Deguchi | 307/494 |
| 4,857,777 | 8/1989 | Altes | 328/155 |
| 4,922,127 | 5/1990 | Denny | 328/55 |
| 4,951,000 | 8/1990 | Dautriche | 328/155 |
| 4,977,382 | 12/1990 | Podell et al. | 333/164 |
| 5,084,686 | 1/1992 | Chun | 333/164 |
| 5,121,077 | 6/1992 | McGann | 330/149 |

FOREIGN PATENT DOCUMENTS

| 0066352 | 6/1977 | Japan | 307/262 |
|---|---|---|---|
| 0027715 | 2/1980 | Japan | 307/262 |
| 0082530 | 6/1980 | Japan | 307/262 |
| 0056523 | 4/1983 | Japan | 328/155 |
| 0156914 | 6/1986 | Japan | 328/155 |
| 2127844 | 5/1990 | Japan | |
| 3258056 | 11/1991 | Japan | |
| 403278611 | 12/1991 | Japan | 328/155 |
| 404349707 | 12/1992 | Japan | 328/155 |

Primary Examiner—Timothy P. Callahan
Assistant Examiner—Tuan T. Lam
Attorney, Agent, or Firm—Leydig, Voit & Mayer

[57] ABSTRACT

A phase shifter receiving an input signal and producing two output signals having a 90° phase difference from each other includes first and second input nodes for respectively receiving first and second signals having opposite phases; a first serial connection of a first resistor and a second resistor at a resistor node, the first and second resistors having the same resistance values, a first end of the first serial connection being connected to the first input node; a second serial connection of a first capacitor and a second capacitor at a capacitor node, the first and second capacitors having the same capacitance values, the second serial connection being connected between the second end of the first serial connection and the second input node; and first and second output nodes respectively connected to the resistor node and the capacitor node, producing output signals having a 90° phase difference from each other. Output voltages having phases orthogonal to each other can be produced by a single current path with amplitude characteristics similar to those of the conventional 0°/90° phase shifter using differential circuits and integrating circuits. The orthogonality is maintained over a wide frequency band as in a conventional phase shifter.

10 Claims, 25 Drawing Sheets $f = f_0$ f=f0 f=f0

PHASE SHIFTER

FIELD OF THE INVENTION

The present invention relates to a phase shifter and, more particularly, to a 90° phase shifter appropriate for integration and that can be included in a quadrature modulator or the like used for digital mobile communication.

BACKGROUND OF THE INVENTION

In the field of mobile communication, such as automobile telephone or portable telephone, an analog modulation system, represented by frequency modulation, has been conventionally employed. A digital modulation system has been recently utilized. Accompanying that change, production of an IC circuit for a quaternary modulator as a key device in the modulation section for performing multi-value digital modulation such as QPSK(quaternary phase shift keying) has been of increasing importance.

FIG. 21 is a diagram illustrating a transmitter and a receiver section of a portable telephone as an example of an apparatus using this quadrature modulator.

In FIG. 21, an audio signal converted to an analog signal by the phone receiver 221 is made a digital signal coded by the codec (CODEC) 220 in response to an instruction from the control section 219 and is output to the waveform generating circuit 218. The waveform generating circuit 218 is constituted by a DSP (digital signal processor) 218d, a ROM 218c, D/A converters 218a and 218b. In response to an instruction from the control section 219, it narrows the band of the digital signal input from the CODEC 220 by the DSP 218d, and decomposes the signal into I and Q signals, i.e., two signals having phases 90° different from each other, using waveform data stored in the ROM 218c, and converts these signals to analog signals in the D/A converters 218a and 218b and outputs those analog signals to the quadrature modulator 216. The quadrature modulator 216 performs quadrature modulation of the analog I and Q signals output from the waveform generating circuit 218 using the local oscillator signal output from the frequency synthesizer 217. The quadrature modulated signal is up-converted to a radio frequency by the local oscillation signal output from the frequency synthesizer 215 at the modulator 214 to be output to the high output amplifier 213. The high output amplifier 213 amplifies the output signal of the modulator 214 to a high power output. The output of this amplifier 213 is output to the antenna 211 through the transmit and receive switch 224 to be radiated into space.

On the other hand, the antenna 211 and the antenna 212 constitute a so-called diversity antenna, and upon receipt of electromagnetic waves this diversity antenna supplies an input signal to the receiving part 222. The receiving part 222 amplifies the waves received by this diversity antenna and outputs the same to the demodulation section 223. The demodulation section 223 demodulates the output of the receiving section 222 and outputs the same to the CODEC 220. The CODEC 220 demodulates the digital signal demodulated by the demodulation section 223 to an audio signal and outputs the same to the phone receiver 221.

In this way, in the next generation portable telephone, i.e., so-called codeless telephone or an automobile telephone, a digital transmission system is employed. This digital transmission system does not modulate the frequency of the carrier with an audio signal as in FIG. 22(a), but modulates the phase of the carrier with the audio data as shown in FIG. 22(b).

In this digital transmission system, when phase information is carried on the carrier, the modulation is performed by using the values of $(0, \pi/2, \pi, 3\pi/2)$ which are marked with white round mark ○ or the values of $(\pi/4, 3\pi/4, 5\pi/4, 7\pi/4)$ which are marked with black round mark ● in FIG. 22(c), requiring a quadrature modulator.

FIG. 24 shows a block construction of a quadrature modulator including a 0°/90° phase shifter In FIG. 24, reference numeral 1 designates an input buffer which performs waveform reforming of a signal input from the carrier wave input terminal Reference numeral 2 designates a 0°/90° phase shifter for separating the signal wave reformed by the input buffer 1 into two signals having phases different by 90°. Reference numeral 3 designates a buffer for wave reforming the output of the phase shifter 3. Reference numeral 4 designates a double balanced mixer which performs double balanced modulation of the base band signal as a signal to be modulated by the output of the buffer 3. The usual balanced mixer is only balanced to the carrier wave, and therefore, the signal to be modulated as well as the carrier wave do not appear at the output side, while a modulating signal such as an audio signal appears at the output side. On the other hand, the double balanced mixer is balanced to the carrier wave as well as to the modulated wave, and therefore only the signal to be modulated appears at the output, and neither of the carrier wave and the modulation wave appear at the output side. Further, reference character BB designates its base band signal input terminal, OUT designates an output signal terminal for the double balanced mixer 4, a, b, and c designate signal lines respectively connecting the input buffer 1 and the 0°/90° phase shifter 2, the 0°/90° phase shifter 2 and the buffer 3, and the buffer 3 and the double balanced mixer 4, respectively.

Next, a description is given of the operation.

The carrier wave signal input from the carrier wave input terminal IN is wave-reformed by the input buffer 1, and is output to the 0°/90° phase shifter 2. In this 0°/90° phase shifter 2, the input signal is separated into two series of signals which have phases shifted by 0°/90° relative to the input signal, and they are output to the buffer 3. In the buffer 3, the wave-reforming of the input signal is performed in the same way as in the input buffer 1, and is output to the double balanced mixer 4. In the double balanced mixer 4, the base band signal input from the base band signal input terminal BB is used as a signal to be modulated to perform the double balanced modulation, thereby the modulated signal is output from the output signal terminal.

FIG. 23 is a diagram for explaining the operation of the quadrature modulator. In FIG. 23, the carrier wave input signal of $\cos \omega t$ which is input to the 0°/90° phase shifter 231 is converted to two signals by the 0°/90° phase shifter 231 which are shifted in phase by 0° and 90°, respectively, relative to the input signal of $\cos \omega t$, to be output to the double balanced mixers 232 and 233, respectively. In the double balanced mixers 232 and 233, the base band signals I(t) and Q(t) are respectively input as modulation signals and they are modulated by $\cos \omega t$ and $\sin \omega t$, respectively, as output signals $I(t)\cos \omega t$ and $Q(t)\sin \omega t$. These signals are input to the synthesizer circuit 234, thereby a quadrature modulated wave $$e(t) = I(t)\cos \omega t + Q(t)\sin \omega t$$

is output.

Here, when it is supposed that $I(t) = \cos \phi(t)$ and $Q(t) = -\sin \phi(t)$, phase modulated waves are obtained as represented by, $$e(t) = \cos \phi(t) : \cos \omega t - \sin \phi(t) : \sin \omega t = \cos(\omega t + \phi(t)),$$

and when this $\phi(t)$ is given as $0, \pi/2, 3\pi/2, \pi$, QPSK (quaternary phase shift keying) modulated wave is obtained.

Here, in this quadrature modulation, the balancing and the orthogonality of carriers, i.e., how close the phase difference is to 90° affects the positions of the black round marks and white round marks in FIG. 22(c), and when the positions of these black round marks and white round marks in FIG. 22(c) are deviated, the quality of the modulation signal is reduced and demodulation is made difficult.

In other words, in the quadrature modulator, when the positions of the black marks and the white marks are deviated, there arises an image component of the modulation signal component, that is, an unrequited mirror image component. The mirror image component is deviated from the carrier wave by a frequency corresponding to the modulated signal, and in order to sufficiently suppress this image component, the preciseness of orthogonality of the carrier in the 0°/90° phase shifter, that is, the phase difference of the carrier at precisely 0° and 90°, respectively, is important.

The 0°/90° phase shifter of such construction is conventionally constructed by using such as delay lines and microwave strip lines. However, there has been arising a necessity of realizing the 0°/90° phase shifter also by a construction appropriate for circuit integration of a quadrature modulator in an integrated circuit. In order to realize a quadrature modulator superior in modulation characteristics, how a small-sized 0°/90° phase shifter which is strong against variations of elements and appropriate for circuit integration, determines the performance of the IC and the yield thereof.

The phase shifter described in the following is an example of a conventional phase shifter circuit which requires no large chip area for an inductor and can be constructed of only resistors, capacitors, and transistors, and is appropriate for circuit integration.

FIG. 25 illustrates a phase shifter circuit which utilizes an all band pass type circuit as a conventional 0°/90° phase shifter, and described in FIG. 1 of "Monolithic RC All-Pass Networks with Constant-Phase-Difference Outputs", on pp. 1533–1537 of "IEEE TRANSACTIONS ON MICROWAVE THEORY AND TECHNIQUES, VOL. MTT-34, NO. 12".

In FIG. 25, reference character IN1 designates a positive phase signal input terminal to which a positive phase signal of positive phase and negative phase input signals is applied, reference character IN2 designates a negative phase signal input terminal to which the negative phase signal having a phase shift of 180° relative to said positive phase signal is input. Reference numeral $V_{DD}$ designates a power supply terminal, reference character $V_{CS}$ designates a constant current source bias terminal, and reference characters OUT1 and OUT2 designate output signal terminals. J1 and J2 designates a pair of differential FETs having the same gate widths, for example 30 μm to 100 μm, to which gates the positive phase signal and the negative phase signal are input, respectively. J3 designates a constant current FET having a drain connected to the commonly connected sources of the differential FETs J1 and J2, R3 designates a resistor connected between the source of the constant current FET J3 and the ground, R1 and R2 designate load resistors having the same resistance values, for example 1 to 3 kΩ, connected between the drains of the differential FETs J1 and J2 and the power supply $V_{DD}$.

Further, J4 and J6 designate source follower FETs having drains connected to the power supply terminals $V_{DD}$ and having gates connected to the terminals of the resistors R1 and R2 at the side opposite to the power supply terminal and which have the same gate widths. J5 and J7 designate constant current FETs having drains connected to the sources of the source follower FETs J4 and J6 and which have the same gate widths. R4 and R5 designate the constant current resistors having the same resistance values connected between the sources of the constant current FETs J5 and J7 and the ground, respectively. Here, the constant current FETs J5 and J7 are provided for increasing the impedance conversion effect due to the source follower FETs J4 and J6, that is, the effect of increasing the input impedance and decreasing the output impedance, and therefore these are not necessarily required. So, these can be omitted and the sources of FETs J4 and J6 may be directly connected to the resistors R4 and R6.

In addition, the FETs J3 to J7 all have gate widths of 50 μm to 100 μm and the resistors R3 to R5 all have resistance values of 200 Ω to 1 kΩ.

In addition, reference characters Ra and Rb, and Ca and Cb designate resistors, and capacitances which together constitute the 0°/90° phase shifter. The resistor Ra and the capacitor Ca are connected in series to each other and the resistor Rb and the capacitor Ca are connected in series to each other, and these two serially connected circuits 25a and 25b are connected between the sources of the source follower FETs J4 and J6, in parallel with each other. The output terminal OUT1 is taken out from the connection node between the resistor Ra and the capacitor Ca and the output terminal OUT2 is taken out from the connection node of the resistor Rb and the capacitor Cb. Reference numerals n4 and n6 designate source nodes of the source follower FETs J4, J6, respectively, and V1, V2 designate voltages of the nodes n4, n6, respectively, and Vout1 and Vout2 designate voltages of the output terminals OUT1 and OUT2, respectively.

In FIG. 25, a differential amplifier circuit 11a comprising the FETs J1, J2, J3 and resistors R1, R2, R3 is provided at a prior stage of the two source followers 11b and 11c comprising the FETs J4, J5 and the resistor R4, and the FETs J6, J7 and the resistor R5, respectively, is only illustrated as means for inputting signals having phases shifted by 180° from each other to the FETs J4 and J6, respectively. The signals input to the input terminals IN1 and IN2 are not necessarily required to be of reverse phases, and either of the signal terminals can be made a reference of a constant voltage.

FIG. 26 is a diagram illustrating vectors of V1, V2(= −V1), and Vout1, Vout2 when the values of the resistors Ra, Rb, and the capacitors Ca, Cb constituting the 0°/90° phase shifter 11d are set so that the Vout1 and Vout2 are made orthogonal to each other at the target frequency and $\Delta \phi$ in the figure represents a phase difference between signals of the output voltages Vout1 and Vout2.

A description is given of the operation.

The signals input from the input terminals IN1 and IN2 are amplified by the differential amplifiers 11a, the differential outputs thereof are impedance converted to low impedances by the source follower circuit 11b and 11c, respectively, and are output to the 0°/90° phase shifter 11d. In this phase shifter 11d, the resistance values of the resistors Ra and Rb and the capacitance values of the capacitors Ca and Cb are set so that two signals having phases orthogonal to each other at a specific frequency are output from the two outputs Vout1 and Vout2, respectively.

From FIG. 26, because the 0°/90° phase shifter is of all-band pass type, when, for example, the center frequency is 250 MHz, the amplitudes of Vout1 and Vout2 are equal to the amplitudes of V1 and V2 over a wide band of 180 to 340 MHz, and the Vout1 and Vout 2 are represented as moving on an arc of a circle with diameters of V1 and V2 because the vectors of voltages RaIa and Ia/jωCa arising at the both ends of the resistors Ra and Rb and the capacitors Ca and Cb, respectively, are orthogonal to each other, and also the vectors RbIb and Ib/jωCb are mutually orthogonal to each other. Therefore, by setting the values of the resistances Ra, Rb, and the capacitances Ca, Cb, it is possible to output signals having phases deviated by 90° from each other from the output terminals Vout1, Vout2, so that the phase difference $\Delta\phi$ produced by Vout1 and Vout2 be 90°.

That is, in this 0°/90° phase shifter, the voltage vectors Vout1 and Vout2 move on the arc of the circle with the originating point O of the voltage vectors V1 and V2(=−N1), and the triangle $\Delta1$ with the voltage vectors Vout1 and V1 and the triangle $\Delta2$ with the voltage vectors Vout2 and V2 become isosceles triangles. Here, when the Ra, Ca, Rb, Cb are set such that $1/\omega Ca\cdot\tan 22.5° = Ra$ and $Rb\cdot\tan 22.5° = 1/\omega Cb(\omega = 2\pi f0$ : f0 is a target frequency), because the angles $\phi1$, $\phi2$ become 22.5°, the $\phi21$ produced by the voltage vector V1 and the Vout2 and the angle $\phi12$ produced by the voltage vector V2 and the Vout1 become 45°. Thereby, the angle $\Delta\phi$ produced by the voltage vector Vout1 and the Vout2 are made 90° and the phases of the output signals Vout1 and Vout2 are made orthogonal to each other.

Even without employing such a setting, by only appropriately setting the resistance values of the resistors Ra and Rb and the capacitance values of Ca and Cb appropriately, the output signals Vout1 and Vout2 can be made orthogonal to each other. This can be accomplished, for example, by setting the values as Ra=650 Ω, Ca=0.6 p F, Rb=280 Ω, Cb=0.25 pF, at frequency f0=950 MHz.

However, in this phase shifter, the Vout1 and Vout2 are generated by two serial connection circuits 25a and 25b, and the current paths generating the Vout1 and Vout2 are provided separately, the frequency band that can maintain a phase shift difference of 90° cannot be made so wide, and, for example, when the center frequency is 250 MHz, the range in which the phase difference of 90° can be maintained is limited to the vicinity of that frequency. In addition, the accuracy of the orthogonality of the separated signals into 0° signal and 90° signal components as a function of variations in the element characteristics in the resistors Ra and Rb and the capacitors Ca and Cb when the circuit is integrated is low.

FIG. 27 is a diagram illustrating an example of a phase shifter according to the prior art that can solve such a problem. In this circuit, by constituting a 0°/90° phase shifter of differential circuits and integrating circuits, the problem of low accuracy of the orthogonality as a function of element variations in the circuit of FIG. 25 can be solved.

In FIG. 27, reference character IN designates a single signal input terminal, reference characters J11 and J13 designate source follower circuits which receive the input signal from the signal input terminal at their gates. The gate widths of the source follower FETs are equal to each other and the drains thereof are both connected to the power supply terminal $V_{DD}$. J12 and J14 are constant current source FETs having gate widths equal to each other, and to the gates thereof a constant voltage is applied from the constant current source bias terminal $V_{CS}$. Here, the FETs J12 and J14 are for strengthening the impedance conversion function of the source follower FETs J11 and J13 and are not necessarily required. Further, the gate widths of the FETs J11 to J14 are, for example, 30 to 50 μm. The R11 and R12 designate resistors connected between the sources of the constant current source FETs J12 and J14 and the ground, respectively, and the resistance values thereof are, for example, 200 Ω to 1 kΩ. The Ca and Ra designate a capacitor and a resistor constituting the differential circuit 27a connected between the source node of the source follower FET J11 and the ground. The Rb and Cb designate a resistor and a capacitor constituting the integrating circuit 27b, and they are connected between the source node n3 of the source follower FET J13 and the ground. These resistors Ra and Rb are, for example, both 670 Ω when the target frequency is 950 MHz, and the capacitances are both, for example, 0.25 pF. The OUT1 is an output signal terminal and this is connected to the connection node of the capacitor Ca and the resistor Ra. The OUT2 is an output signal terminal connected to the connection node of the resistor Rb and the capacitor Cb. The Vi and V2 (=V1) are voltages of the nodes n1 and n3, respectively, and the Vout1 and Vout2 are voltages of the output terminals OUT1 and OUT, respectively.

A description is given of the operation.

A signal input from the signal input terminal IN is impedance converted by the source follower circuit 13a comprising FETs J11, J12, and the resistor R11 and the source follower circuit 13b comprising FETs J13 and J14, and the resistor R12, and they are output to the differential circuit 13c comprising the capacitor Ca and the resistor Ra and the integrating circuit 13d comprising the resistor Rb and the integrating circuit 13d.

FIG. 28 illustrates a vector diagram showing vectors V1, V2(=V1), Vout1, and Vout2 at frequency f=f0 when the values of the resistor and the capacitor of the differential circuits 13c and the integrating circuit 13d are set so as to satisfy the following:

$Ra = Rb = R$, $Ca = Cb = C$ $f0 = \tfrac{1}{4}\pi RC$ at the frequency f0.

In FIG. 28, $\phi_1$ represents the phase difference of V1 and Vout1 and $\phi_2$ represents the phase difference of V1 and Vout1.

At frequency f=fO, the differential circuit 27a has the same values for the absolute value for the voltage vector RaIa due to the voltage difference of the resistor Ra and the absolute value for the voltage vector Ia/j$\omega$Ca due to the voltage difference of the capacitor Ca. Those voltage vectors are orthogonal and the triangle $\Delta 11$ produced by both vectors and a sum vector of them is a right-angled isosceles triangle, and the output Vout1 advances in its phase $\phi_{01}$ by +45° with relative to the phase of the input V1. The integrating circuit 27b has, as in the differential circuit 27a, the same values for the absolute value for the voltage vector RbIb due to the voltage difference of the resistor Rb and the absolute value for the voltage vector Ib/j$\omega$Cb due to the voltage difference of the capacitor Cb which voltage. Those vectors are orthogonal and the triangle $\Delta 12$ produced by both vectors and a sum vector is a right-angled isosceles triangle and the voltage Vout2 is retarded in its phase by 45° with relative to the phase of the input V1. As a result, the phase difference $(\theta_1 + \theta_2)$ between those becomes 90°. However, the amplitudes of the outputs Vout1 and Vout2 are reduced to lower values than the amplitude of the input V1 (=V2) due to the high pass characteristics of the differential circuit 27a and the low pass characteristics of the integrating circuit 27b. In addition, although the amplitudes of Vout1 and Vout2 are different from each other at a frequency other than f=fO, the phase difference therebetween $(\theta_1 + \theta_2)$ is still maintained at 90°.

FIG. 29 is a diagram illustrating the amplitude characteristics of the output signals Vout1 and Vout2, as a function of the input frequency of the phase shifter of FIG. 27. FIG. 29 shows that the frequency at which the amplitudes of the Vout1 and Vout2 become equal to each other is only f=fO due to the high pass characteristics of the differential circuit and the low pass characteristics of the integrating circuits.

FIG. 30 shows the vector diagrams of V1 and V2(=V1), Vout1, Vout2 when the resistance values Ra (Rb) constituting the phase shifter in the circuit of FIG. 27 are increased to a value a little larger than the design value R, or when the capacitance value Ca(=Cb) of the capacitor is increased to a value a little larger than the design value C.

In FIG. 30, $\theta_1$ designates a phase difference between V1 and Vout1, and $\theta_2$ designates a phase difference between V1 and Vout1.

From FIG. 30, the angle $\theta_1$ is produced by Vout1 when V1 is small while the angle $\theta_2$ is produced by Vout2 when V2 is large, and the amplitudes of the Vout1 and Vout2 are different at f=fO while the sum of the phase difference between them, i.e., $\theta_1 + \theta_2$, is kept at 90°.

The reason therefor is because the absolute value of the voltage vector RaIa for the resistor Ra constituting the differential circuit 27a and the absolute value of the voltage vector RbIb for the resistor Rb constituting the integrating circuit 27b are equal to each other, and the absolute value of the voltage vector Ia/j$\omega$Ca for the capacitor constituting the differential circuit 27a and the absolute value of the voltage vector Ib/j$\omega$Cb for the capacitor constituting the integrating circuit 27b are equal to each other because Ra=Rb=R, Ca=Cb=C on an assumption that V1=V2. The right-angled triangle $\Delta 11$ constituted by the voltage vector RaIa, the voltage vector Ia/j$\omega$Cb, and the voltage vector V1, and the right-angled triangle constituted by the voltage vector RbIb, the voltage vector Ib/j$\omega$Cb, and the voltage vector V2 become congruent, and as a result, the angle $\phi_1$ produced by the voltage vector Ia/j$\omega$Ca and the voltage vector V1, and the angle $\theta_2$ produced by the voltage vector Ib/j$\omega$Cb and the voltage vector V2 are equal to each other. The angle $\phi_{32}$ produced by the voltage vector RbIb and the voltage vector V2 and the angle $\phi_1$ produced by the voltage vector RaIa and the voltage vector V1 are equal to each other, resulting in that the angle $\theta_1 + \theta_2$ becomes necessarily 90°.

Therefore, this type of phase shifter can be said to have directionality over a wide range and is also resistant to variations in the elements.

In addition, as a conventional phase shifter that can maintain the phase difference between the orthogonal components while employing resistors and capacitors, there is a quadrature modulator disclosed in Japanese Published Patent Application Hei.2-127844, as one other than those illustrated in FIGS. 25 and 27.

FIG. 31 shows a construction of this quadrature modulator. In FIG. 31, reference numeral 311 designates a carrier wave input terminal, reference numeral 312 designates a first mixer for modulating a same phase component, reference numeral 313 designates a second mixer for modulating a quadrature component. The output of the first mixer 312 is connected to the modulation output terminal 316 via the resistive two-terminal circuitry 314. In addition, the output terminal of the second mixer 313 is connected to the modulation wave output terminal 316 via the capacitive two-terminal circuitry 315.

Next, the operation of this quadrature modulator will be described with reference to FIG. 32. First of all, suppose that the carrier wave which is input to the carrier wave input terminal 311 is V1=exp(j$\omega$t), the base band signal which is input to the first mixer 312 is VI, and the base band signal which is input to the second mixer 313 is VQ. The output VIo of the first mixer 312 and the output VQo of second mixer 313 are respectively represented as follows:

$$ViO = VI \cdot V1 = VI \cdot \exp(j\omega t)$$

$$VQo = VQ \cdot V1 = VQ \cdot \exp(j\omega t)$$

In addition, the modulation wave output Vo(t) output from the modulated wave output terminal 316 is represented by the following formula if the resistance value of the resistive two-terminal circuitry 314 is R, the capacitance of the capacitive two-terminal circuitry 315 is C, and the output impedances of the first mixer 312 and the second mixer 313 are sufficiently low;

$$Vo = a1 \cdot V1 + a2 \cdot VQ$$

here
$a1 = 1/(1 + j\omega CR)$,
$a2 = j\omega CR/(1 + j\omega CR)$,
and if these a1 and a2 are expressed in phases, then
$a1 = A1 \cdot \exp(j\phi_1)$,
$a2 = \exp(j\phi_2)$
here,
$A1 = 1/(1 + (\omega CR)^{\frac{1}{2}})$,
$A2 = \omega CR/(1 + (\omega CR)^2)^{\frac{1}{2}}$
$\phi_1 = \tan^{-1}(-\omega R)$, $$\phi 2 = \tan^{-1}(1/\omega CR)$$

The phasers of a1 and a2 move on the circle of diameter 1 as shown in FIG. 32. Then, the phase difference $\Delta\phi$ between $\phi 1$ and $\phi 2$ becomes, employing a relation of $$(a2/a1) = (A2/A1)\cdot\exp(j(\phi 2 - \phi 1))$$

as follows:

$$\begin{aligned}
\Delta\phi &= \phi 2 - \phi 1 \\
&= \tan^{-1}[\{(\text{imaginary part }(a2/a1))/(\text{real part }(a2/a1))\}] \\
&= \pi/2
\end{aligned}$$

and, irregardless of the values of $\omega$, C, and R, it becomes 90°. Accordingly, the phase difference between the same phase component (a1·V1) and the orthogonal component (a2·VQ) in the above-described voltage Vo=a1·V1+a2·VQ is also kept at 90°.

While in this circuit the phase difference between the same phase component and the orthogonal component is kept at 90° independent of the value of the carrier wave frequency and the values of the circuit elements, the amplitude synthesization ratio K between the same phase component and the orthogonal phase component becomes $$K = A2/A1 = \omega CR$$

and, it becomes the equi-amplitude synthesization when $\omega CR = 1$.

FIG. 33 shows a phase shifter in which an FET 341 is provided in parallel with the resistor 342 as the resistive two-terminal circuitry 340, so as to enable the equi-amplitude synthesization, and the applied voltage of the amplitude synthesization ratio control terminal 343 which is connected to the gate thereof to be adjusted, whereby the amplitude synthesization ratio can be adjusted by simply employing the quadrature modulator.

FIG. 34 shows another phase shifter in which a diode 351 is connected in parallel with the condenser 352 as a capacitive two-terminal circuitry 350, so as to enable the equi-amplitude synthesization, and the cathode of the diode 351 is grounded via the choke coil 353. The applied voltage of the amplitude synthesization ratio control terminal 355 connected via the choke coil 354 to the anode of the diode 351 is adjusted, whereby the amplitude synthesization ratio can be adjusted by simply employing the quadrature modulator.

However, these prior art quadrature modulators shown in FIGS. 31 and 34 are not those used in a construction in which the input signal is initially separated into the components having phase differences of 0° and 90° by the 90° power splitter 361, and the respective signals are amplified by the differential amplifiers 362 and 363 and modulated by the I channel double balanced mixer 364 and the Q channel double balanced mixer 365. These are synthesized by the 0° synthesizer 366 and then amplified by the buffer amplifier 367 to be output. To the contrary, these quadrature modulators are applied to a 90° synthesizer of a quadrature modulator in a construction in which a local oscillator input is amplified by a single differential amplifier 371, the modulated outputs are synthesized with those signals having a 90° phase difference therebetween by the 90° synthesizer 374, and amplified by the buffer amplifier 375, because two differential amplifiers are required in the construction of FIG. 35(a). Thus, the structures of these quadrature modulators in FIGS. 31 and 34 are clearly different from those shown in FIGS. 25 and 27 which are 90° phase shifters in which the quadrature modulation signal is separated firstly by the 90° phase shifter and is modulated by a mixer.

In the quadrature modulator of FIG. 35(b), there would occur an amplitude difference in the 90° synthesizer at the last stage, and if no adjusting circuit is employed, this amplitude error cannot be solved. Therefore, the circuit of FIG. 31 would necessarily cause a problem in yield when it is constituted in the circuit construction as it is, and in order to avoid this, a circuit as shown in FIGS. 33 and 34 is required.

As a quadrature modulator that aims at dispensing with adjustments at the microwave band, Japanese Published Patent Application Hei.3-258056 discloses a non-adjustment quadrature modulator requiring no adjustment for quadrature PSK.

FIG. 36 shows a construction of this prior art non-adjustment modulator for quadrature PSK. Reference numeral 381 designates a local oscillator provided at outside, reference numeral 382 designates an input side EX-OR circuit which receives the I signal and the output of the local oscillator, reference numeral 383 designates a D flip-flop as a two frequency divider to which the output of the input side EX-OR circuit is input as a clock. An output signal, $\overline{Q}$, is fed back to its D input, a signal which is obtained by two frequency divisions is output. Reference numeral 384 designates an output side EX-OR circuit which receives the Q signal and the output of the two frequency divider 384 as two inputs.

Next, a description will be given of the operation with reference to FIGS. 37(a)–37(d). The input side EX-OR circuit 382 operates as non-inverting for the output signal (1) from the local oscillator 381 when the input I=L, and operates as inverting for the signal (1) when the input signal I=H.

FIG. 37(a) shows where the state of I=L and Q=L; the output signal (1) of the local oscillator 381 which is input to the EX-OR circuit 382 as the input side gate is input as shown by (2), as a clock C of the two-divider circuit 383, remaining non-inverted. The two divider circuit 383 outputs the data of the D input at every rising of the clock C from the regular output terminal Q, and therefore, it outputs IF modulated wave as shown by (4), by dividing the input of the clock input terminal C by two, as shown by (3).

FIG. 37(b) shows where the state of I=H and Q=L; FIG. 37(d) shows where the state of I=H and Q=H, and FIG. 37(c) shows where the state of I=L and Q=H, the phases are sequentially shifted by 90° at prescribed IF output as shown by the output of IF modulation wave of (4), and thus a modulator of non-adjustment for four phase PSK is realized.

However, the circuit of FIG. 36 is fundamentally different from the circuits of FIGS. 25 and 27 and also the operation frequency is limited by the flip-flop, and therefore, there arises a problem that some device is required in constructing a circuit for an actual mobile communication apparatus.

In this way, conventionally, 0°/90° phase shifters appropriate for circuit integration which can be constituted only by resistors, capacitors, and transistors are limited to those utilizing the all-band pass circuit as shown in FIG. 25, or those which, using differential circuits and integrating circuits and utilizing the phase difference of the high pass filter characteristics and the low pass filter characteristics, separates the signals to those having phases of 0° and 90° phases.

However, in the circuits of FIG. 25 and 27 two current paths for output voltages orthogonal to each other are provided. When an adjustment circuit is provided only in one of the current paths so as to adjust element variations of the resistors and capacitors, influences by providing this adjustment circuit other current paths are affected, and it is required to provide similar adjustment circuits so as to cancel these influences, thereby resulting in difficulty in maintaining the orthogonality of the two output signals.

SUMMARY OF THE INVENTION

It is an object of the present invention to provide a phase shifter that can be constituted by resistors, capacitors, and transistors, that is appropriate for circuit integration, and that separates the input signal to two signals having the phase difference of 0° and 90° by constructions other than those of the above-described constructions.

It is another object of the present invention to provide a phase shifter of a construction that enables adjusting the center frequency easily even when the center frequency is deviated from a design value by element variations.

It is a still another object of the present invention to provide a phase shifter that outputs not only signals having phase differences of 0° and 90° and orthogonal to each other but also signals having phase differences of 0°, 90°, 180°, and 270° and orthogonal to each other.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

According to a first aspect of the present invention, a 90° phase shifter which receives an input signal and separates the input signal into two signals having a 90° phase difference from each other, includes: first and second input nodes for receiving two signals having phases 180° apart from each other; a first serial connection of a first resistor and a second resistor, the first and second resistors having the same resistance values, one end of the first serial connection being connected to the first input node; a second serial connection of a first capacitor and a second capacitor, the first and second capacitors having the same capacitance values and being connected between a second end of the first serial connection and the second input node; first and second output nodes taken respectively from the node between the first resistor and the second resistor and the node between the first capacitor and the second capacitor, to output signals having a 90° phase difference from each other.

According to a second aspect of the present invention, in the 90° phase shifter of the above-described construction, the first resistor and the second resistor are both variable resistors having the same variable amount, and thus the center frequency of the phase shifter is variably controlled.

According to a third aspect of the present invention, in the 90° phase shifter of the above described construction, the variable resistors comprises two field effect transistors respectively connected in series between the first resistor and the second resistor, and voltages for varying the resistance values thereof are applied respectively between the gate electrodes of two FETs and the electrodes of the two FETs are commonly connected to each other.

According to a fourth aspect of the present invention, in the 90° phase shifter of the above-described construction, the first capacitor and the second capacitor are both variable capacitors with the same variable amount, and thus the center frequency of the phase shifter is variably controlled.

According to a fifth aspect of the present invention, in the 90° phase shifter of the above-described construction, the variable capacitors comprise two diodes respectively connected in parallel with the first capacitor and the second capacitor in a reverse direction to each other, and voltages for varying the capacitance values are respectively applied to the anode and the cathode of those diodes.

According to a sixth aspect of the present invention, a 90° phase shifter that separates an input signal into four signals having 90° phase differences from each other, comprises first and second input nodes for receiving two signals respectively having phases by 180° apart from each other; third and fourth input nodes for receiving two signals having respectively the same phases as the signals received by the second and the first input nodes; a first serial connection of a first resistor and a second resistor having the same resistance values, a first end of the first serial connection being connected to the first input node; a second serial connection of a first capacitor and a second capacitor having the same capacitance values, connected between the second end of the first serial connection and the second input node; a third serial connection of a third resistor and a fourth resistor having the same resistance values, a first end of the third serial connection being connected to the second input node; a fourth serial connection of a third capacitor and a fourth capacitor having the same capacitance values, connected between the second end of the third serial connection and the fourth input node; first, second, third, and fourth output nodes respectively connected to the node connecting the first resistor and the second resistor, the node connecting the first capacitor and the second capacitor, the node connecting the third resistor and the fourth resistor, and the node connecting the third capacitor and the fourth capacitor as output signals respectively having 90° phase differences sequentially from each other.

According to a seventh aspect of the present invention, in the 90° phase shifter of the above-described construction, the first resistor, the second resistor, the third resistor, and the fourth resistor are all variable resistances having the same variable amounts whereby the center frequency of the phase shifter is variably controlled.

According to an eighth aspect of the present invention, in the 90° phase shifter of the above-described construction, the variable resistors include two field effect transistors respectively connected in series between the first resistor and the second resistor, and voltages for varying the resistance values thereof are applied respectively between the gate electrodes of the two FETs and the electrodes of the two FETs commonly connected to each other, and two field effect transistors respectively connected in series between the third resistor and the fourth resistor, voltages for varying the resistance values being applied respectively between the gate electrodes of the latter two FETs and the electrodes of the two FETs commonly connected to each other.

According to a ninth aspect of the present invention, in the phase shifter of the above-described construction, the first capacitor, the second capacitor, the third capacitor, the fourth capacitor, are all variable capacitors having the same variable amount, thereby the center frequency of the phase shifter is variably controlled.

According to a tenth aspect of the present invention, in the phase shifter of the above-described construction, the variable capacitors comprise two diodes connected in parallel with the first capacitor and the second capacitor, respectively, in directions reverse to each other, and to which paths, between their anode and cathode, voltages for varying the capacitance values thereof are applied, and two diodes connected in parallel with the third capacitor and the fourth capacitor, respectively, in directions reverse to each other, and to which paths, between their anode and cathode, voltages for varying the capacitance values are applied.

DETAILED DESCRIPTION OF THE PREFERRED EMBODIMENT

Figure 1:
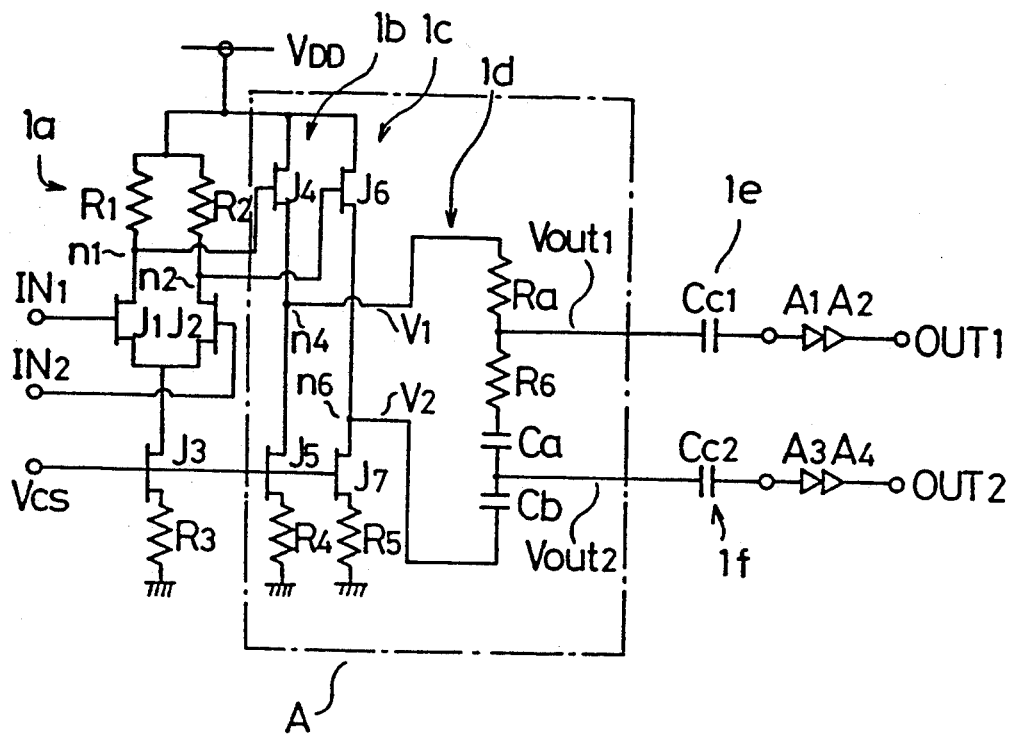
FIG. 1 is a schematic diagram of a phase shifter according to a first embodiment of the invention.

FIG. 1 is a diagram illustrating a 0°/90° phase shifter according to a first embodiment of the present invention, using a differential amplifier and two source follower circuits. This phase shifter circuit is constituted by elements such as resistors, capacitors, and transistors which are appropriate for circuit integration, and is easy to connect with input/output buffer circuits.

In FIG. 1, reference character IN1 designates a positive phase signal input terminal to which the positive phase signal of a pair of input signals is input, IN2 designates a negative phase signal input terminal to which the negative phase signal of the pair of the input signals, having a phase by inverted relative to the positive phase signal, is input, J1 and J2 designate a pair of differential FETs to the gates of which the above-described positive phase signal and the negative phase signal are input, respectively. These FETs have gate widths of 30 to 100 $\mu$m. J3 designates a constant current FET having a drain connected to the common source of the differential FETs J1 and J2. R3 designates a resistor connected between the base of the constant current FET J3 and the ground, R1 and R2 designate load resistors connected between the drains of the differential FETs J1 and J2 and the power supply voltage $V_{DD}$, and these both have resistance values of 1 to 3 k$\Omega$.

Further, J4 and J6 designates source follower FETs having drains connected to the power supply terminal $V_{DD}$, gates connected to the terminals n1 and n2 of the resistors R1 and R2 at the opposite side to the power supply terminal $V_{DD}$, and gate widths of 30 to 100 μm. J5 and J7 designate constant current FETs having drains respectively connected to the source nodes n4 and n6 of the source follower FETs J4 and J6, and gate widths of 30 to 100 μm. R4 and R5 designate resistors connected between these constant current FETs J5 and J7 and the ground, respectively, and have resistant values of 200 to 1000 Ω similarly to the resistor R3. $V_{CS}$ designates a constant current source bias terminal which applies a constant voltage to the gates of the FETs J3, J5, and J7 to make these operate as a constant current source.

Further, Ra and Rb, and Ca and Cb designate resistors and capacitors constituting a 0°/90° phase shifter 1d, and when this circuit is used as for example a 0°/90° phase shifter for a portable telephone operating at 950 MHz, Ra and Rb are a first resistor and a second resistor having a resistance value of 335 Ω, Ca and Cb are a first and a second capacitor having a capacitance of, for example, 0.5 pF, and these elements are connected in this order between the nodes n4 and n6 in series to each other. OUT1 and OUT2 designate output signal terminals producing output signals having phases 90° different from each other, and the output signal terminal OUT1 is connected to the connection node of the resistor Ra and Rb via a coupling capacitor CC1 having a capacitance value of 1 pF, and the output signal terminal OUT2 is connected to the connection node of the capacitors Ca and Cb via a coupling capacitor CC2 having a capacitance value of, for example, 1 pF.

Here, V1 and V2 designate voltages of the node n4 and n6, respectively, Vout1 and Vout2 designate voltages of the output terminals OUT1 and OUT2, respectively, and to the output terminals OUT1 and OUT2, the two-stage amplifiers A1 and A2 and the two-stage amplifiers A3 and A4 are connected, respectively.

Here, in FIG. 1, a differential amplifier circuit 1a comprising FETs J1, J2, J3 and resistors R1, R2, R3 is provided at a stage after the source follower circuit comprising FETs J6, J7, and R5. However, this is only to ease the connection with the differential amplifier circuit, thereby to simplify the incorporation into an actual quadrature modulator as means for inputting signals reverse in phases to each other. The construction of the phase shifter may be of another type.

In addition, the signals input to the input terminals IN1 and IN2 are not necessarily in reverse phase and either, i.e., the two signals may be a reference of a constant voltage.

Next, a description is given of the operation.

A pair of signals input from the signal input terminals IN1 and IN2 are amplified by the differential amplifier circuit comprising FETs J1, J2, J3 and the resistors R1, R2, R3 and the differential output thereof is respectively impedance converted by the source follower circuit 1b comprising the FETs J4, J5 and resistor R4, and the source follower circuit 1c comprising FETs J6, J7, and resistor R5, to a low impedance, and are output to the 0°/90° phase shifter 1d comprising resistors Ra and Rb and the capacitors Ca and Cb. In the 0°/90° phase shifter 1d, two signals having phases are deviated by 90° from each other on the basis of the input signals, and these are output to the amplifiers A1, A2 and the amplifiers A3, A4, via the output circuit 1e comprising a coupling capacitor CC1, and the output circuit 1f comprising a coupling capacitor CC2, respectively.

Figure 2:
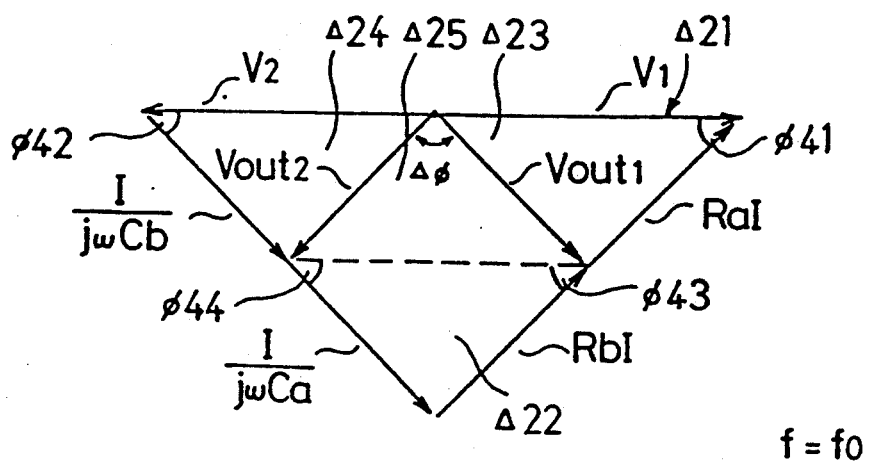
FIG. 2 is a vector diagram illustrating the performance of the phase shifter of FIG. 1.

FIG. 2 is a vector diagram illustrating vectors V1, V2(=−V1), Vout1, and Vout2 at frequency f=f0 when the values of resistances and capacitances are set so that the resistances Ra, Rb and capacitances Ca, Cb satisfy $Ra=Rb=R,$ $Ca=Cb=C$ $f0=1/(2\pi RI)$ at frequency f0, supposing that the output impedances of the two source follower circuits comprising, for example, J4, J5, R4 and J5, J6, and R5 are sufficiently low. The Δφ in the figure represents the phase difference produced by the output voltage Vout1 and Vout2 in the figure.

Because the input voltages of the phase shifter have a phase difference of 180° therebetween and the resistors Ra and Rb and the capacitors Ca and Cb are connected in series to each other, the voltage vectors thereof are such that the vectors RaI and RbI are arranged on a first straight line and the vectors I/jωCa and I/jωCb are arranged on a second straight line perpendicular to the first straight line.

In this FIG. 2, Ra=Rb=R and Ca=Cb=C, and f=1/(2πRC), the amplitudes of the input Vout1 and Vout2 are equal to each other, and the phase difference between the Vout1 and Vout2 is 90°.

The reason therefor is that when Ra=Rb=R and Ca=Cb=C, and f=1/(2πRC), as described above, the triangle Δ21 produced by the voltage vectors V1, V2, RaI, RbI, I/jωCa, I/jωCb and the triangle Δ22 that has the voltage vectors RbI, I/jωCa as two edges become similar and the angle φ41 and φ43 and the angle φ42 and the angle φ44 become equal to each other. Therefore, the triangle Δ22, the triangle Δ23 having the voltage vectors V1, RaI as two edges, and the triangle Δ24 having the voltage vectors V2, and I/jωCb have the same size, and the length of Vout1=the length of I/jωCa, and the length of Vout2=the length of RbI, and the triangle Δ25 having the voltage vectors Vout1 and Vout2 as two edges and the triangle Δ22 become a parallelogram. Then, the angle produced by the edge RbI and the edge I/jωCa of the triangle Δ22 is 90°, and the angle Δφ produced by the edges Vout1 and Vout2 is necessarily become 90°.

However, the amplitudes of the outputs Vout1 and Vout2 are made less than the amplitudes of the input V1(=V2) of the phase shifter 1d due to its high band pass characteristics and the low pass characteristics of the integrating circuit. Further, also at the frequency other than f=f0, it is found that the amplitudes of the vectors Vout1 and Vout2 are different and their phase difference Δφ is also kept at 90° by the operating principle of the shifter.

Figure 3:
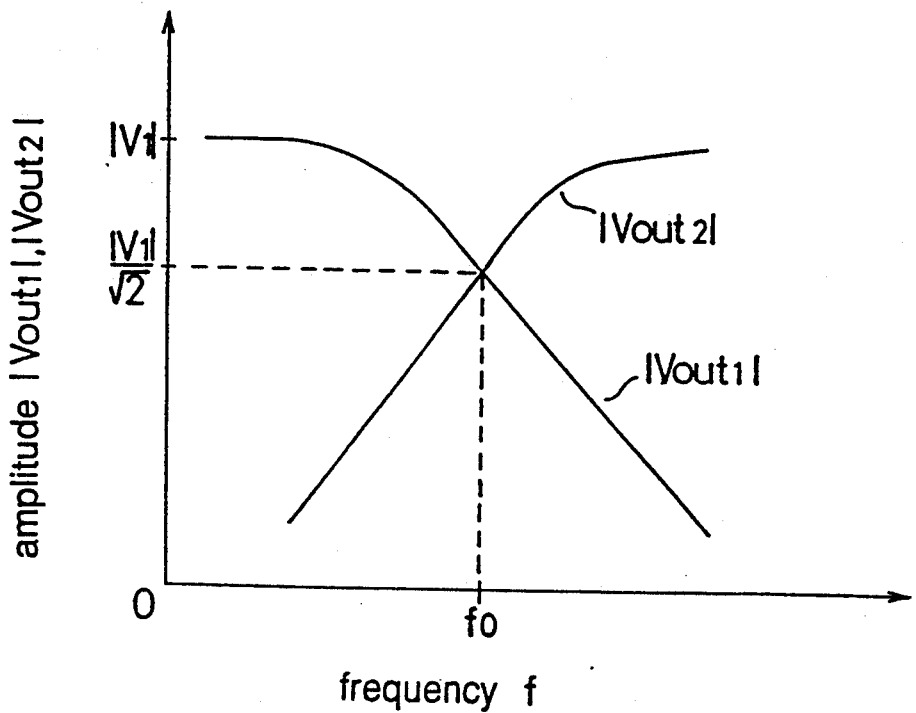
FIG. 3 is a graph of the amplitude of input and output signals in the phase shifter of FIG. 1 as a function of the frequency of the input signal.

FIG. 3 shows the amplitude characteristics of the output voltages Vout1 and Vout2 vs. the input frequency of the phase shifter of the first embodiment. FIG. 3 shows that the Vout1 side has the low pass characteristics of the circuit characteristics of FIG. 1 and the Vout2 side has the high pass characteristics of the circuit characteristics of FIG. 1, and therefore, the frequency at which the amplitudes of Vout1 and Vout2 are equal to each other is only f=fO.

Figure 4:
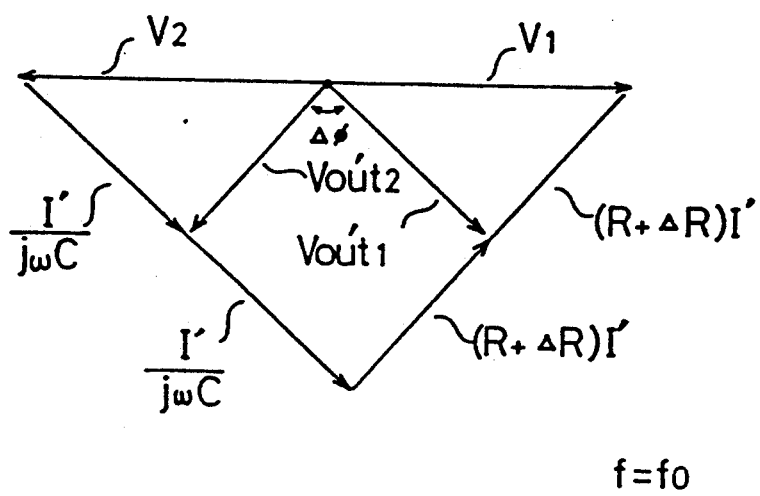
FIG. 4 is a vector diagram illustrating the performance of the phase shifter of FIG. 1 when element values vary.

FIG. 4 is a diagram illustrating vector diagrams of the vectors V1, V2,(= −V1), Vout1, Vout2 when the resistance value Ra (=Rb) of the phase shifter in the circuit of FIG. 1 is increased by ΔR relative to the design value R. In FIG. 4, Δφ represents a phase difference produced by the output voltages Vout1 and Vout2. From FIG. 4, the angle of the vector Vout1 with V1 is large and the angle of the vector Vout2 with the vector V2 (=V1) is small, and the amplitudes of Vout1 and Vout2 are different at the frequency f=fO, but because the resistance values Ra and Rb are equal to each other and the capacitance values Ca and Cb are equal to each other, the straight line combining the pointed ends of the voltage vectors Vout1 and Vout2 is parallel to the voltage vectors V1 and V2 and also of the equal lengths. Accordingly, for the same reason as in the circuit of FIG. 1, the phase difference between Vout1 and Vout2 is kept at 90°.

Figure 5:
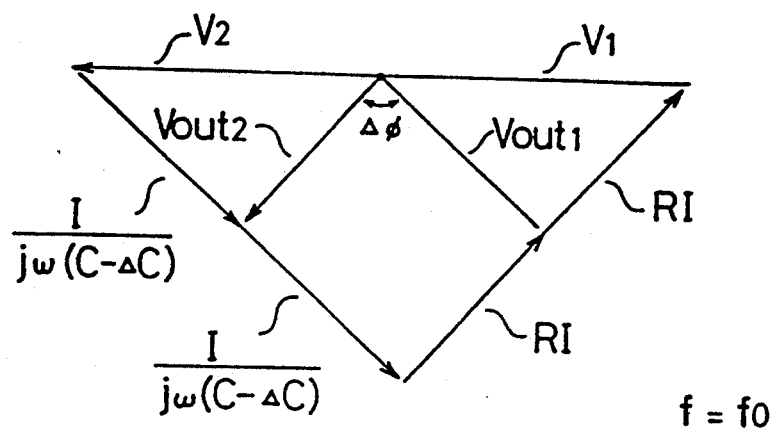
FIG. 5 is a vector diagram illustrating the performance of the phase shifter of FIG. 1 when element values vary.

FIG. 5 shows a vector diagram illustrating the vectors V1, V2(= −V1), Vout1, and Vout2 when the capacitance values Ca (=Cb) of the capacitors of the phase shifter in the circuit of FIG. 1 are reduced by ΔC from the design value C. In FIG. 5, Δφ represents a phase difference produced between the output voltage Vout1 and Vout2. From FIG. 5, the angle of the voltage Vout1 with V1 is small and the angle of Vout2 with V2 (= −V1) is large, and the amplitudes of the Vout1 and Vout2 are difference at frequency of f=fO. However, as in the case of FIG. 4, the phase difference between the Vout1 and Vout2 is kept at 90°.

As is evident from FIGS. 4 and 5, the phase shifter of this first embodiment maintains orthogonality over a wide band, and this phase shifter can resist variations of the elements. In addition, even when the resistance values of the resistors and the capacitance values of the capacitors are deviated at the same time, there arises no problem in accordance with the so-called principle of superposition.

In addition, the difference in the amplitude at the set frequency of the Vout1 and Vout2 can be removed by saturating the amplitudes at a constant value up to the input to the mixer by the next stage buffer shown in FIG. 1, and does not cause problems here.

Embodiment 2

Figure 6:
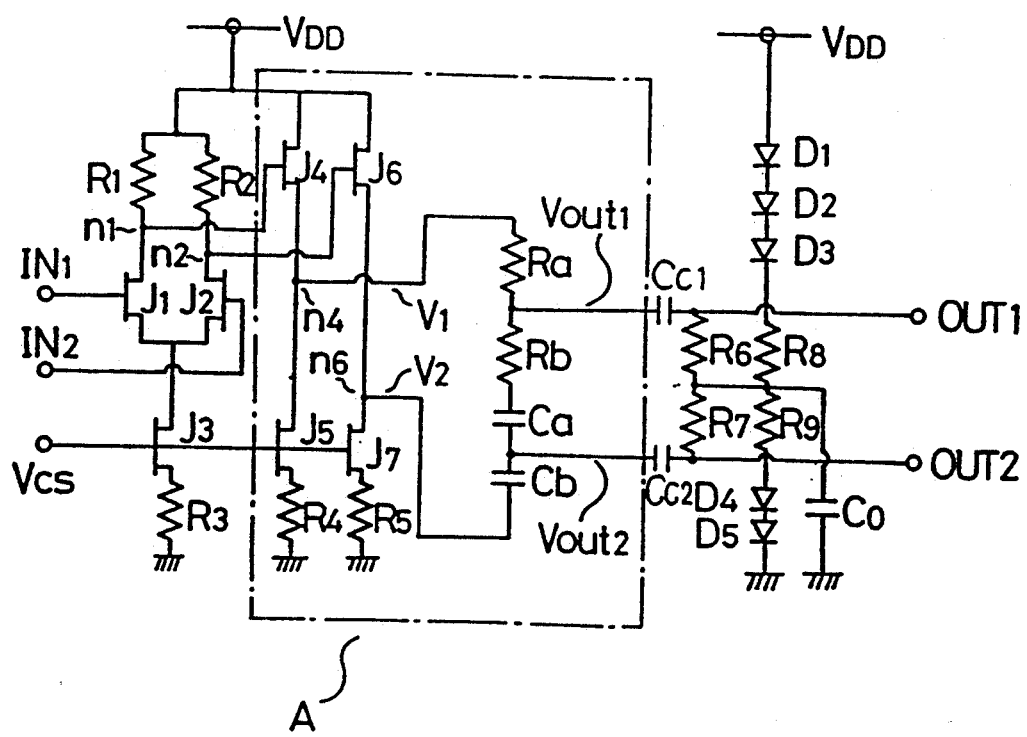
FIG. 6 is a schematic diagram of a phase shifter according to a second embodiment of the invention.

FIG. 6 shows a 0°/90° phase shifter according to a second embodiment of the present invention and in this embodiment, a bias circuit is provided via the coupling condenser in FIG. 1. The circuit comprising resistors R6 to R9, diodes D1 to D5, and capacitor CO is an example of a circuit for applying a dc bias to a high input impedance circuit, for example, a differential amplifier circuit. In this circuit, diodes D1 to D3, resistors R8, R9, diodes D4, D5 are serially connected in this order, and the resistors R8 and R9 have impedance values of, for example, 50 kΩ. In addition, resistors R6 and R7 of about 5 to 10 kΩ are serially connected between the output terminal OUT1 and OUT2, and between the connection node of the resistors R6 and R7, the connection node of the resistors R8, R9 and the ground, for example, through a capacitor CO of 1 pF, is connected. Then, by adjusting the number of diodes, the dc bias applied to the next stage amplifier can be adjusted.

Embodiment 3

Figure 7:
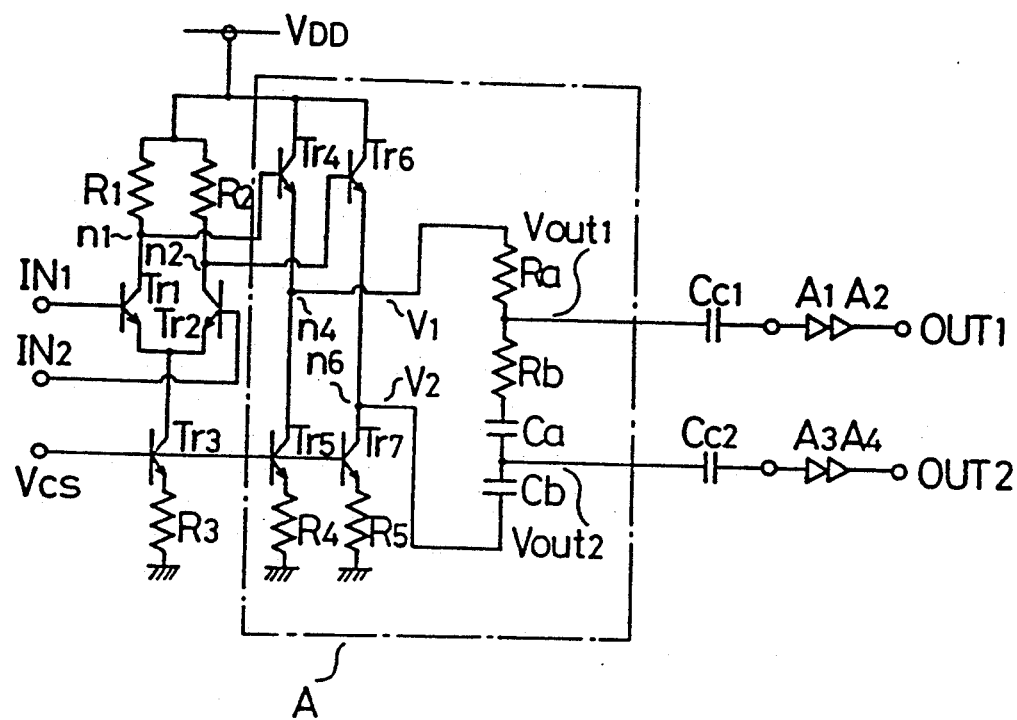
FIG. 7 is a schematic diagram of a phase shifter according to a third embodiment of the invention.

FIG. 7 illustrates a circuit construction of a 0°/90° phase shifter according to a third embodiment of the present invention. In this circuit, the signals having inverted phases are applied to the 0°/90° phase shifter at low impedance employing npn type bipolar transistors Tr1 to Tr7 in place of FETs. Also in this circuit, the orthogonality of output signal phases can be obtained over a wide range as in the circuit of FIG. 1, and also it is possible to obtain a circuit resistant to variations of the elements.

Embodiment 4

Figure 8:
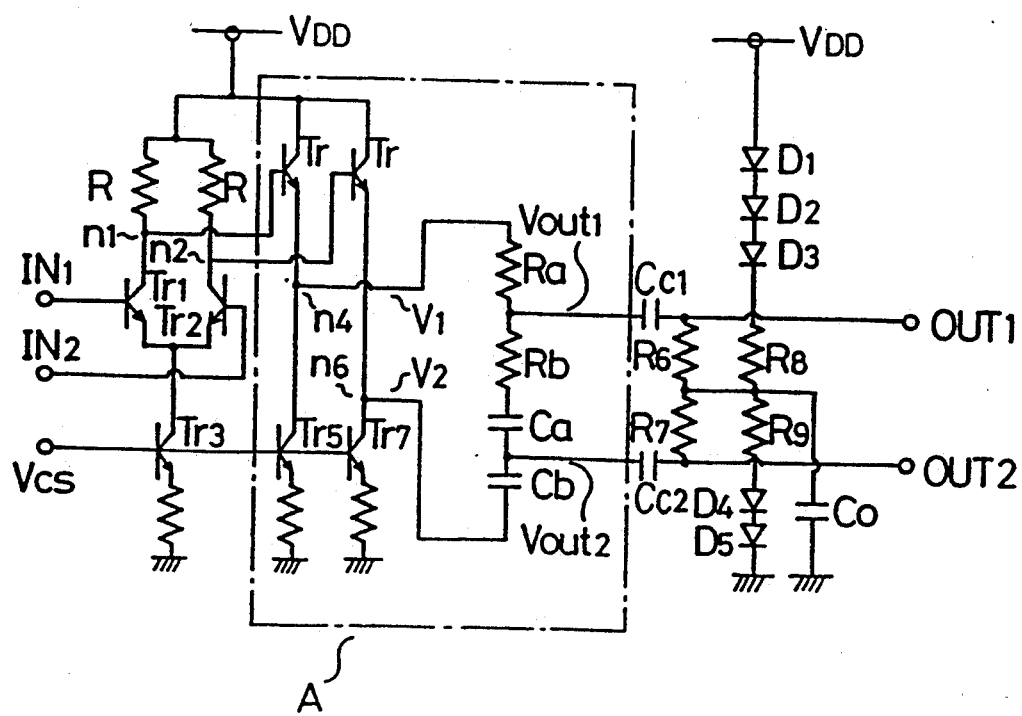
FIG. 8 is a schematic diagram of a phase shifter according to a fourth embodiment of the invention.

FIG. 8 illustrates a 0°/90° phase shifter according to a fourth embodiment of the present invention. In this embodiment, signals having opposite phases are applied to the 0°/90° phase shifter with low impedance employing npn type bipolar transistors Tr1 to Tr7 in place of the FETs in the circuit having a bias circuit shown in FIG. 6, in the FIG. 7. Also in this circuit, the orthogonality of output signal phases over a wide band can be maintained as in FIG. 1, and it is resistant to variations of the elements. By adjusting the number of the diodes, the dc bias applied to the next stage amplifier can be adjusted.

Embodiment 5

Figure 9:
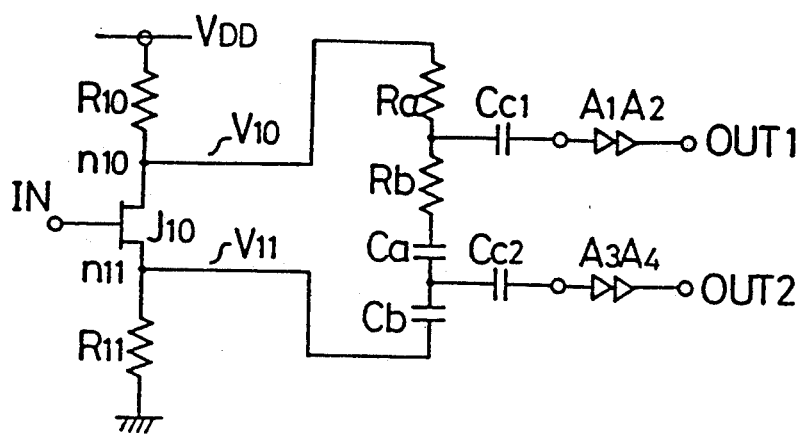
FIG. 9 is a schematic diagram of a phase shifter according to a fifth embodiment of the invention.

FIG. 9 shows a 0°/90° phase shifter according to a fifth embodiment of the present invention. In this embodiment, inverted phase signals are input to a single FET J10, a resistor R10 is connected between its drain and the power supply voltage $V_{DD}$, and a resistor R11 connected between the source of the FET J1 and the ground.

According to this embodiment, mutually reverse phase signals can be input to the 0°/90° phase shifter. In this embodiment, however, because a phase dividing circuit comprising the FET J1 and the resistors R10, R11 is employed, it is not possible to obtain the orthogonality of the output signal over so wide a band as in the circuit of FIG. 1.

Embodiment 6

Figure 10:
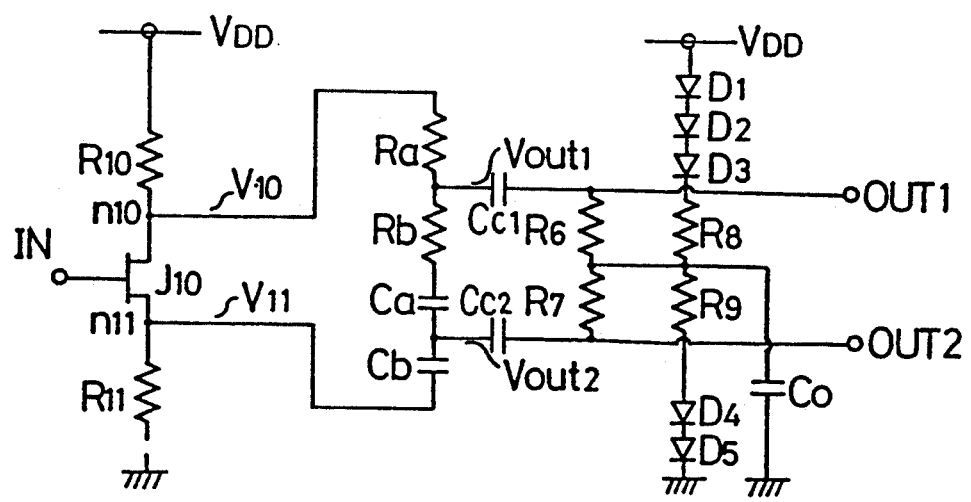
FIG. 10 is a schematic diagram of a phase shifter according to a sixth embodiment of the invention.

FIG. 10 shows a 0°/90° phase shifter according to a sixth embodiment of the present invention, and in this embodiment, mutually reverse phase signals are input to a single FET J10, a resistor R10 is connected between the drain of the FET J10 and the power supply voltage $V_{DD}$, and the resistor R11 is connected between the source of the FET J10 and the ground.

According to this embodiment, mutually reverse phase signals can be input to the 0°/90° phase shifter in a circuit size relatively small compared to the embodiment of FIG. 2.

Embodiment 7

Figure 11:
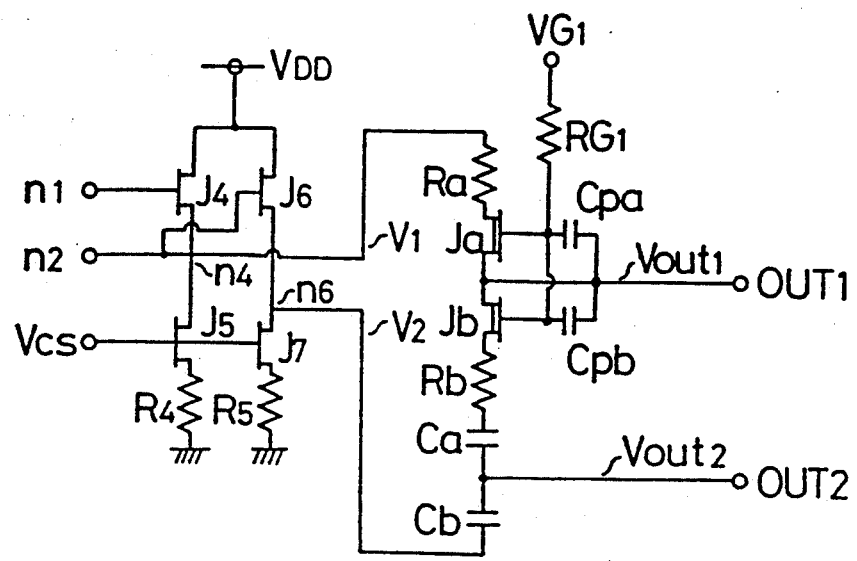
FIG. 11 is a schematic diagram of a phase shifter according to a seventh embodiment of the invention.

FIG. 11 shows a phase shifter according to a seventh embodiment of the present invention, and in this embodiment is a transistor (here, an FET) is inserted between the resistors Ra, Rb thereby to provide a variable resistor in the circuit portion indicated by A in FIG. 1 so as to make variable the set frequency fO as described above. In FIG. 6, Ja and Jb designate FETs serially connected between the resistors Ra and Rb, respectively. Cpa and Cpd are capacitors connected between the connection nodes of the two FETs Ja and Jb and the gates of the FETs Ja and Jb, respectively. These capacitors stabilize the voltage as a bias applied to the gates of the FETs. RG1 designates a high resistance resistor connected between the control voltage input terminal VG1 and each of the gates of the two FETs Ja and Jb. The circuit comprising the capacitors Cpa and Cpb, and the high resistance resistor RG1 is a circuit for applying a bias to the FET so as to make the on-resistances of the FET Ja and Jb variable in response to the control input voltage VG1.

Here, when the variable resistances of the FETs Ja and Jb are equal to each other, the resistance values corresponding to the resistors Ra and Rb of FIG. 1 can be made variable to the degree of the same amount, and therefore, while maintaining the orthogonality of the output voltages Vout1 and Vout2, the set frequency fO can be made variable. As an example of the variable amount of the set frequency fO, if the variations in the circuit elements are supposed to be about 10 to 20%, there may be provided a variable amount that almost cancels this variation amount, that is, the variable amount of about 10 to 20 percent may be provided and the on-resistances of the FETs Ja and Jb may be above, for example, 30 Ω. In addition, the values of the capacitors Cpa and Cpd have values of a few pF and the change of the control voltage input MΩ order is about 0 to 5 V, and the value of the high resistance RG1 has a value of MΩ order. Further, by appropriately setting these parameters, it is also possible to use this in order to change the channel such as to change the target frequency to 900 MHz when that is 950 MHz.

Embodiment 8

Figure 12:
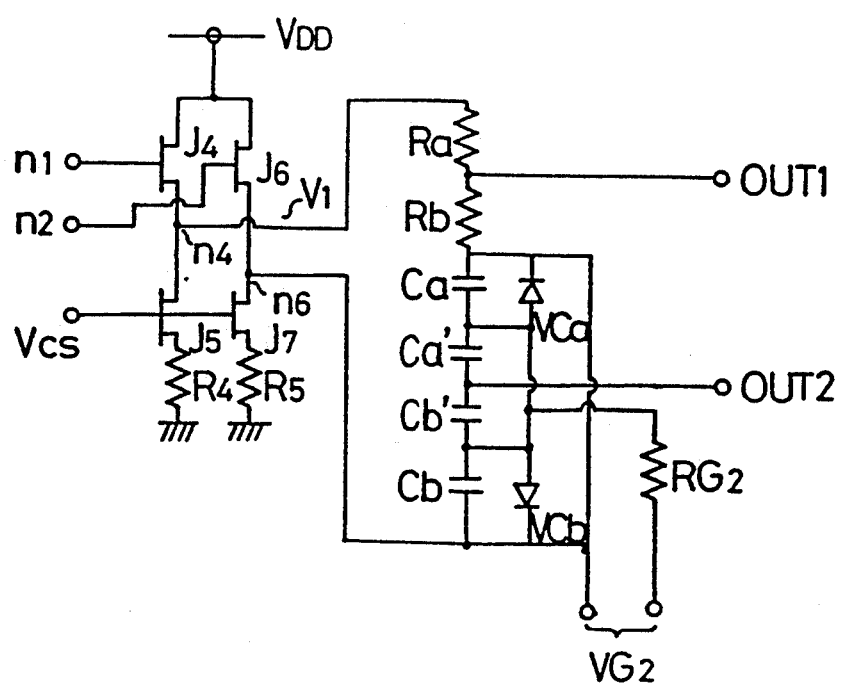
FIG. 12 is a schematic diagram of a phase shifter according to a eighth embodiment of the invention.

FIG. 12 shows a phase shifter according to an eighth embodiment of the present invention. The circuit part shown by A in FIG. 1 is modified to make variable the set frequency. Two reversely biased diodes capacitors Ca and Cb are connected in a reverse polarity serial connection as variable capacitances.

In FIG. 12, VCa and VCb designate diodes which are connected in parallel with the capacitors Ca and Cb, respectively. RG2 designates a high resistance resistor which is connected between the control voltage input terminal VG2 and the cathodes of the diodes VCa and VCb. The Ca' and Cb' in FIG. 12 designates capacitors connected in series between the capacitors Ca and Cb. The circuit comprising these elements VCa, VCb and RG2 varies the capacitances of the VCa and VCb in response to the control input voltage VG2.

Here, when the variable capacitances of VCa and VCb are equal to each other, because the capacitance values corresponding to the Ca and Cb of FIG. 1 can be made variable, and it is possible to vary the set frequency fO while maintaining the orthogonality of the voltages Vout1 and Vout2. As an example of this variable amount of this set frequency, when production variations in the respective circuit elements are for example about 10 to 20%, the variable amount canceling this variation amount, that is, the variable amount of about 10 to 20 percent is enough. Therefore, if the capacitance values of the diodes VCa and VCb are for example, 10 to 20% of the capacitance values of the capacitors Ca and Cb, that is, 0.05 to 0.1 pF, the range of the control voltage input VG2 is about 0 to 5 V.

Also in this embodiment, by appropriately setting the parameters, it is possible to change the channels.

In addition, the variable capacitance of FIG. 12 and the variable resistance of FIG. 10 can be present together, and, while maintaining the orthogonality of the voltages Vout1 and Vout2, the set frequency fO can be varied effectively.

Embodiment 9

Figure 13:
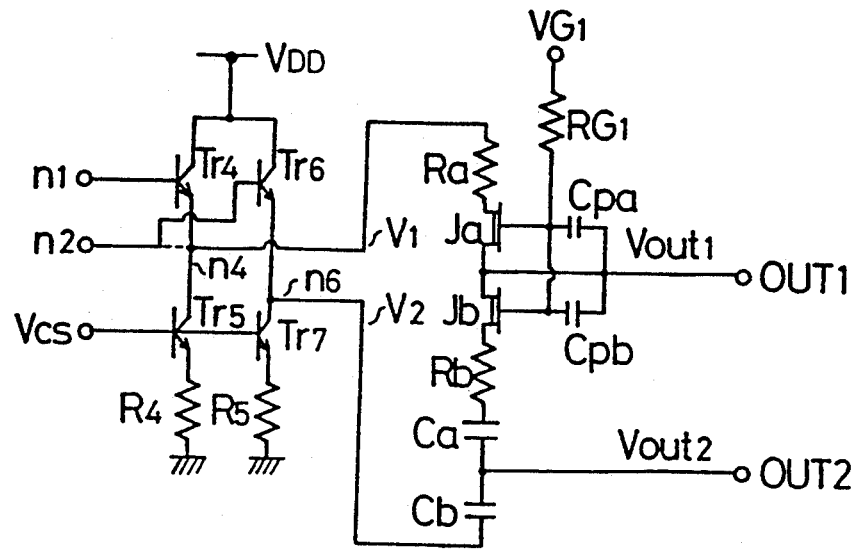
FIG. 13 is a schematic diagram of a phase shifter according to a ninth embodiment of the invention.

FIG. 13 shows a 0°/90° phase shifter according to a ninth embodiment of the present invention, and this embodiment is constituted by realizing the source follower circuit comprising the FETs J4 to J7 of FIG. 11 with npn type transistors Tr4 to Tr7. Thereby, not only in ICs constituted by unipolar transistors such as GaAs ICs, but also in ICs constituted by bipolar transistors, the same effects as in the embodiment of FIG. 11 are obtained.

Embodiment 10

Figure 14:
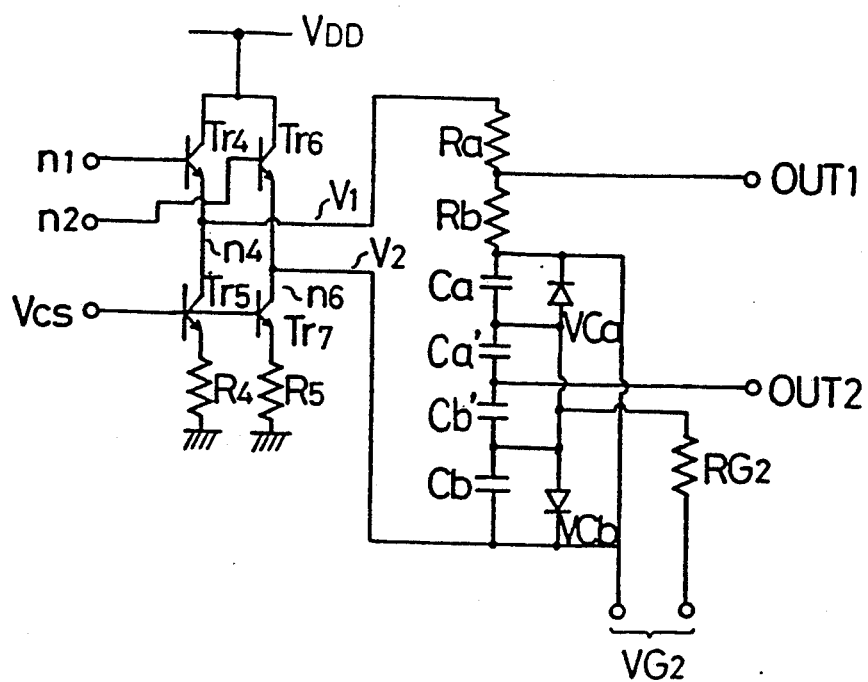
FIG. 14 is a schematic diagram of a phase shifter according to a tenth embodiment of the invention.

FIG. 14 shows a 0°/90° phase shifter according to a tenth embodiment of the present invention, and this is constituted by realizing the source follower circuits comprising FETs J4 to J7 of FIG. 11 with npn transistors Tr4 to Tr7, and also by this construction, the same effects as those in the twelfth embodiment are obtained.

Embodiment 11

Figure 15:
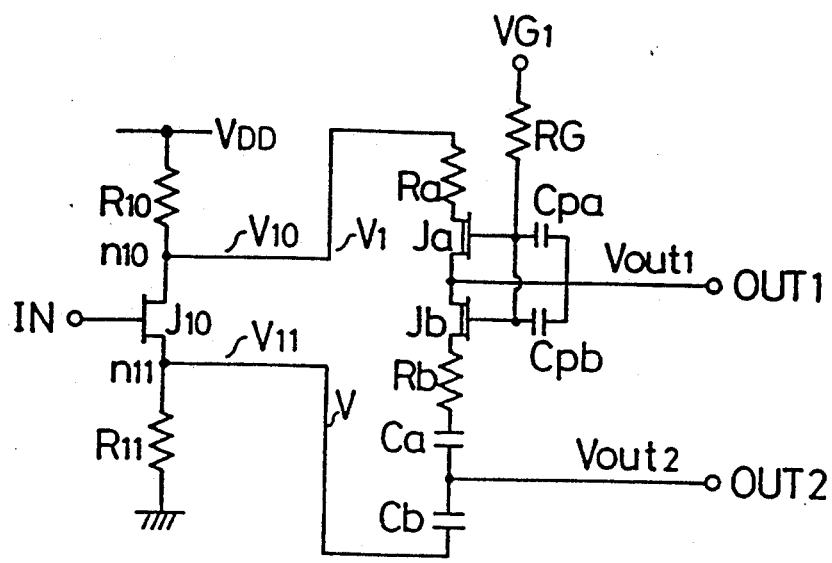
FIG. 15 is a schematic diagram of a phase shifter according to a eleventh embodiment of the invention.

FIG. 15 shows a 0°/90° phase shifter according to an eleventh embodiment of the present invention, and this embodiment is constituted by removing the source follower circuits comprising FETs J4 to J7 of FIG. 11, making it possible to input the reversely inverted phase signals with a single FET J10. Thereby the phase shifter can be realized by a small sized circuit with the same effects as the embodiment of FIG. 11.

Embodiment 12

Figure 16:
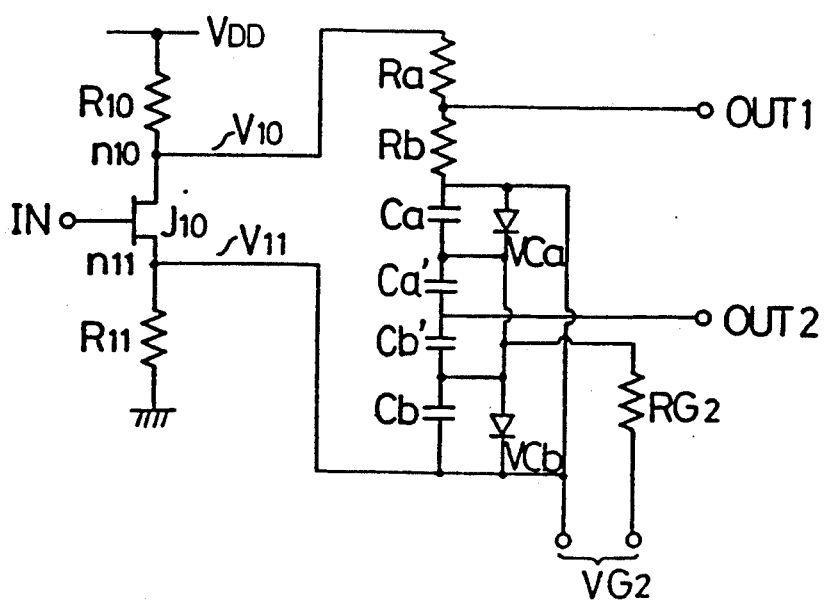
FIG. 16 is a schematic diagram of a phase shifter according to a twelfth embodiment of the invention.

FIG. 16 shows a 0°/90° phase shifter according to a twelfth embodiment of the present invention. This embodiment is constituted by removing the source follower circuit comprising FETs J4 to J7, and making possible the input of the inverted signals by a single FET J10 as shown in FIG. 9. Thereby the phase shifter can be realized by a small sized circuit with the same effects as the embodiment of FIG. 11.

Embodiment 13

FIG. 17(a) shows another type of phase shifter according to a thirteenth embodiment of the present invention, and this embodiment is a 0°/90°/180°/270° phase shifter using FETs. The circuit is constituted by using transistors, resistors, and capacitors which are appropriate for circuit integration, and also make easy connections with such as input/output buffers.

In FIG. 17(a), TA designates a positive phase signal input terminal to which a positive phase signal among a pair of input signals is input, TB designates a negative phase input signal to which a reverse phase signal, inverted by 180° relative to the positive phase signal is input, $V_{DD}$ designates a power supply terminal, OUT1A, OUT2A, OUT1B, OUT2B designate output signal terminals, J1a, J1b designate FETs gates to which a positive signal and a negative signal are respectively input, R1a, R2a designate resistors respectively connected between the power supply $V_{DD}$ and the drain node n1a of the FET J1a, and the ground and the source node n2a of the FET J1a. R1b and R2b designate resistors connected between the power supply $V_{DD}$ and the drain node n1b, and between the ground and the source node n2b of the FET J1b, respectively.

In addition, Ra, Rb, Ca, Cb and Rc, Rd, Cc, Rd designate resistors and capacitors constituting a 0°/90° phase shifter, and Ra, Rb, Rc, Rd designate resistors, Ca, Cb, Cc, Cd designate capacitors. The resistors having the same resistance values Ra, Rb and the capacitors Ca, Cb having the same capacitance values Ca, Cb are serially connected between the drain nodes n1a, n1b of the FETs J1a, J1b. In addition, the resistors Rc, Rd having the the same resistance values and the capacitors Cc and Cd having the same capacitance values are connected between the source nodes n2a and n2b of the FETs J1a, J1b.

In addition, V1a, V2a(=−V1a) designate voltages of the nodes n1a, n2a, V1b, V2b (=−V1b) designates voltages of the nodes n1b, n2b, and Vout1a, Vout2a, Vout1b, and Vout2b, respectively designates the voltages of the output terminals OUT1, OUT2, OUT3, OUT4.

In FIG. 17(a), the circuit comprising the FET J1a, resistor R1a, R2a, and FET J1b, and resistors R1b, R2b is a phase dividing circuit, and the mutually reverse phase signals of TA, TB are obtained by arranging the differential amplifier circuit as shown in FIG. 1 at a prior stage thereof.

FIG. 17(b) shows a vector diagram illustrating vectors of V1a, V2a (=−V1a), V1b, V2b (=−V1b), Vout1a, Vout2a, Vout1b, Vout2b at a set frequency f0 of the 0°/90°/180°/270° phase shifter of FIG. 17(a).

In this FIG. 17(b), Δφa represents a phase difference between the Vout1a and Vout2a, and Δφb represents a phase difference between Vout1b and Vout23b, and Δφd represents a phase difference between Vout2b and Vout1a, respectively.

Figure 17:
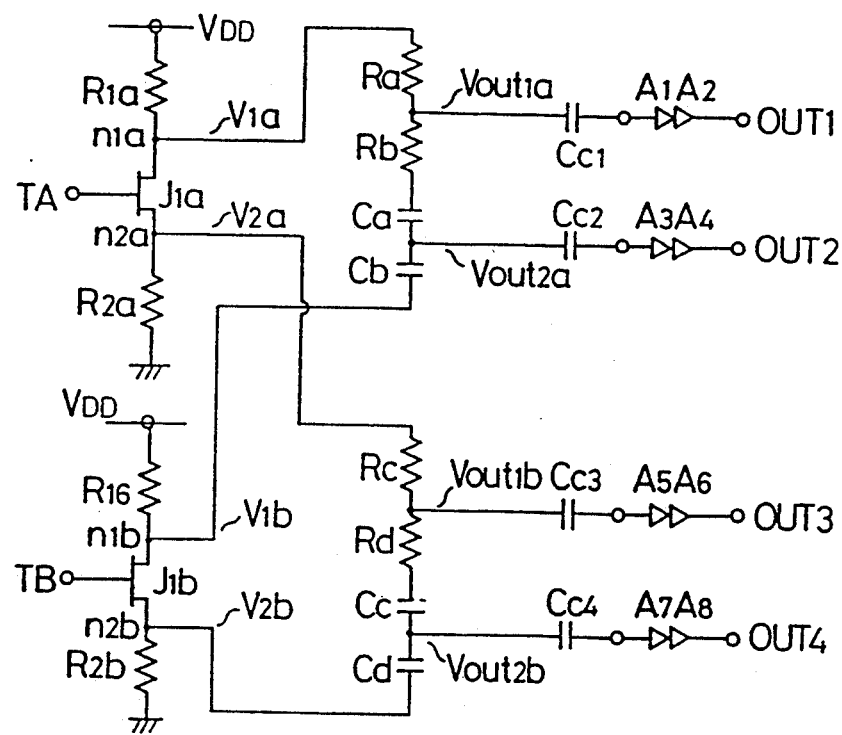
FIG. 17(a) is a schematic diagram of a phase shifter according to a thirteenth embodiment of the invention.
FIG. 17(b) is a vector diagram illustrating the performance of the phase shifter of FIG. 17(a).
Figure 17:
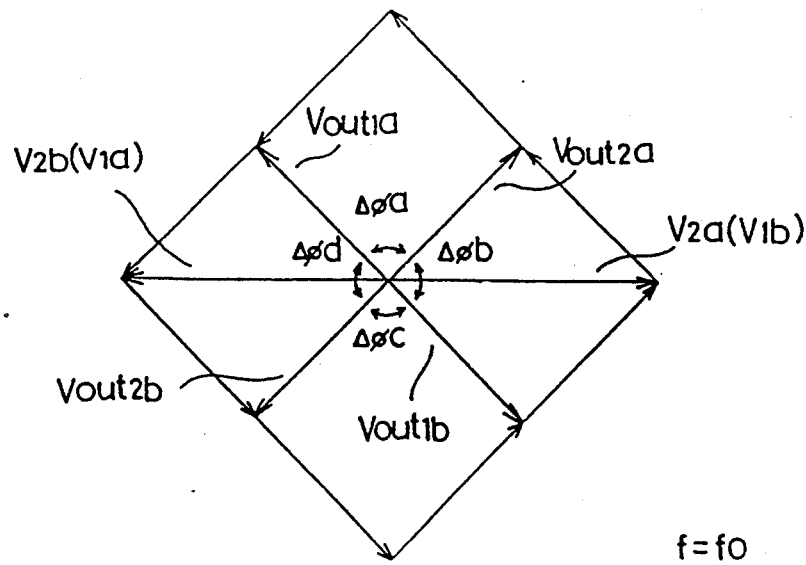

The vector diagram of the FIG. 17(b) is obtained by folding the vector diagram of FIG. 2 with V1, V2 as an axis of symmetry, and accordingly, from the principle shown in FIGS. 1, 2, and 3, the amplitudes of the Vout1a Vout2a, Vout1b, Vout2b are equal to each other and also the mutual phase differences Δφa, Δφb, Δφc, and Δφd become 90°, and their orthogonality can be obtained over a wide band. However, because a phase dividing circuit is used, the orthogonality of the output signal cannot be obtained in so wide a range as in the circuit of FIG. 1. Heretofore, no differential amplifier circuit and source follower circuit are provided at the prior stage as in the circuit of FIG. 1 in the circuit of FIG. 17 because when a differential amplifier circuit and a source follower circuit are provided, adjustments of the element constants are made necessary. Adjustment is troublesome since the circuit of FIG. 17 does not have a complete symmetry as in the circuit of FIG. 1.

Embodiment 14

Figure 18:
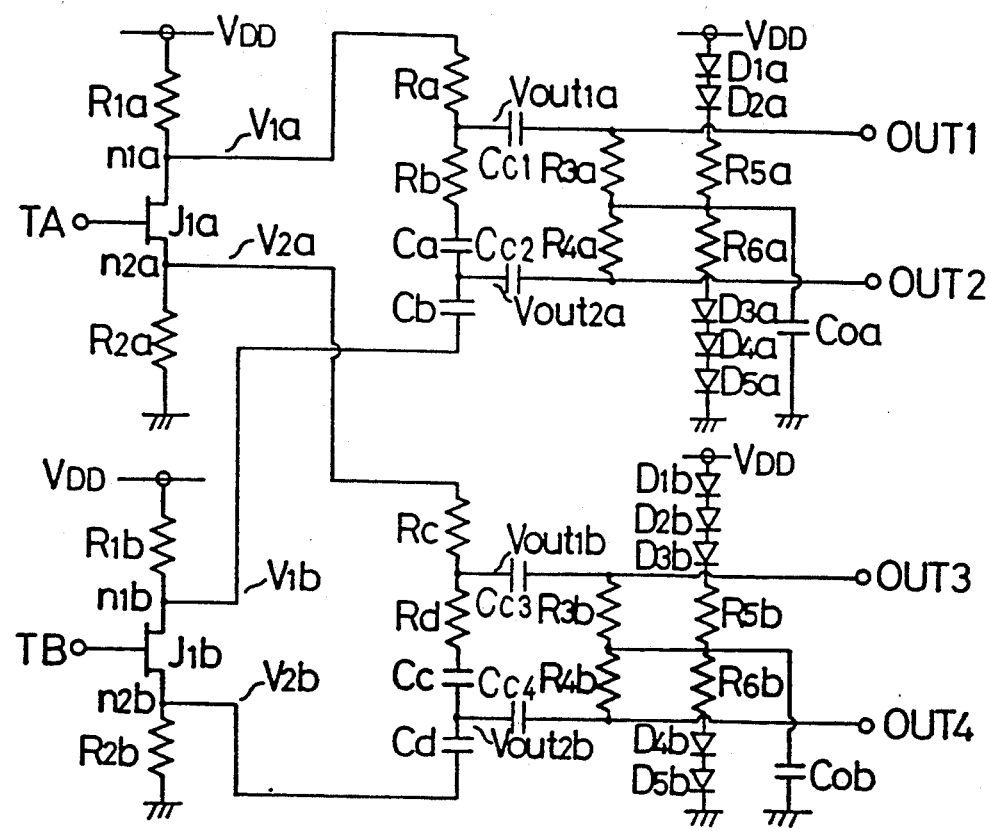
FIG. 18 is a schematic diagram of a phase shifter according to a fourteenth embodiment of the invention.

FIG. 18 shows a 0°/90°/180°/270° phase shifter according to a fourteenth embodiment of the present invention, and this embodiment is constituted by providing a bias circuit via the coupling condenser in FIG. 17. That is, in this FIG. 18, the circuit comprising R3a to R6a, D1a to D5a, C0a and R3b to R6b, D1b to D5b, and C0b is a circuit for applying a bias to the high impedance circuit, such as a differential amplifier circuit connected at the next stage, and R1b to R6a, R1b to R6b are resistors, D1a to D5a, D1g to D5b are diodes, and C0a, and C0b are capacitors for grounding AC signals.

Embodiment 15

Figure 19:
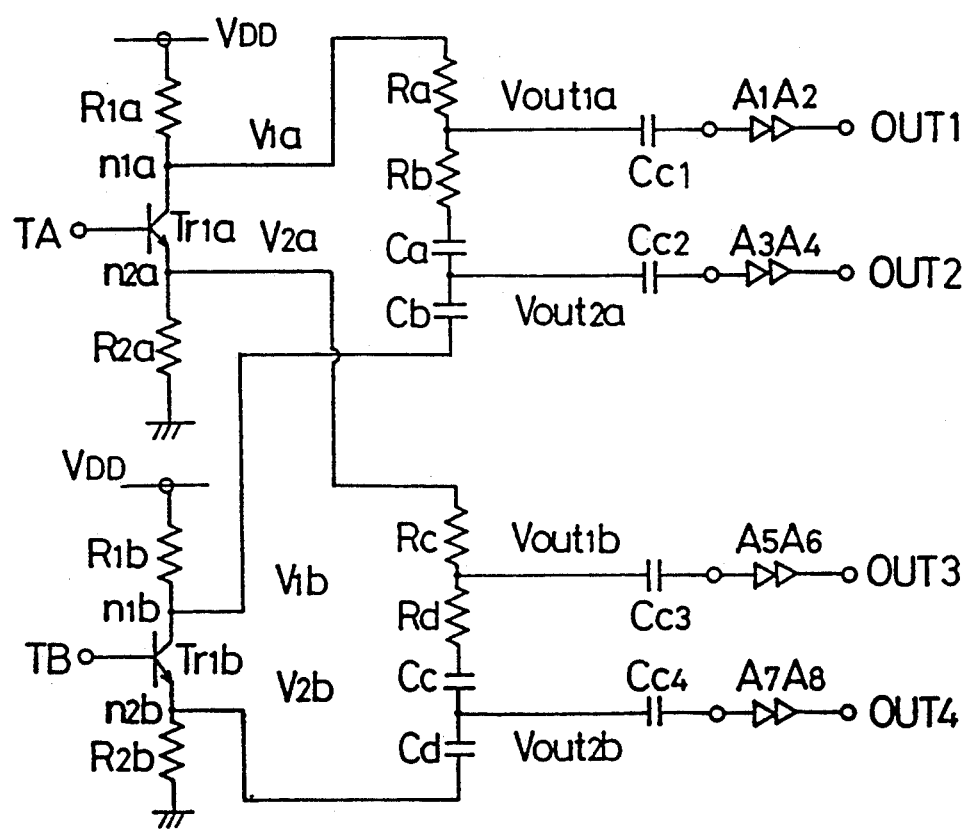
FIG. 19 is a schematic diagram of a phase shifter according to a fifteenth embodiment of the invention.

FIG. 19 shows a 0°/90°/180°/270° phase shifter according to a fifteenth embodiment of the present invention. This is constituted by employing npn type bipolar transistors Tr1a, Tr1b in place of the FETs J1a, J1b of FIG. 17.

Embodiment 16

Figure 20:
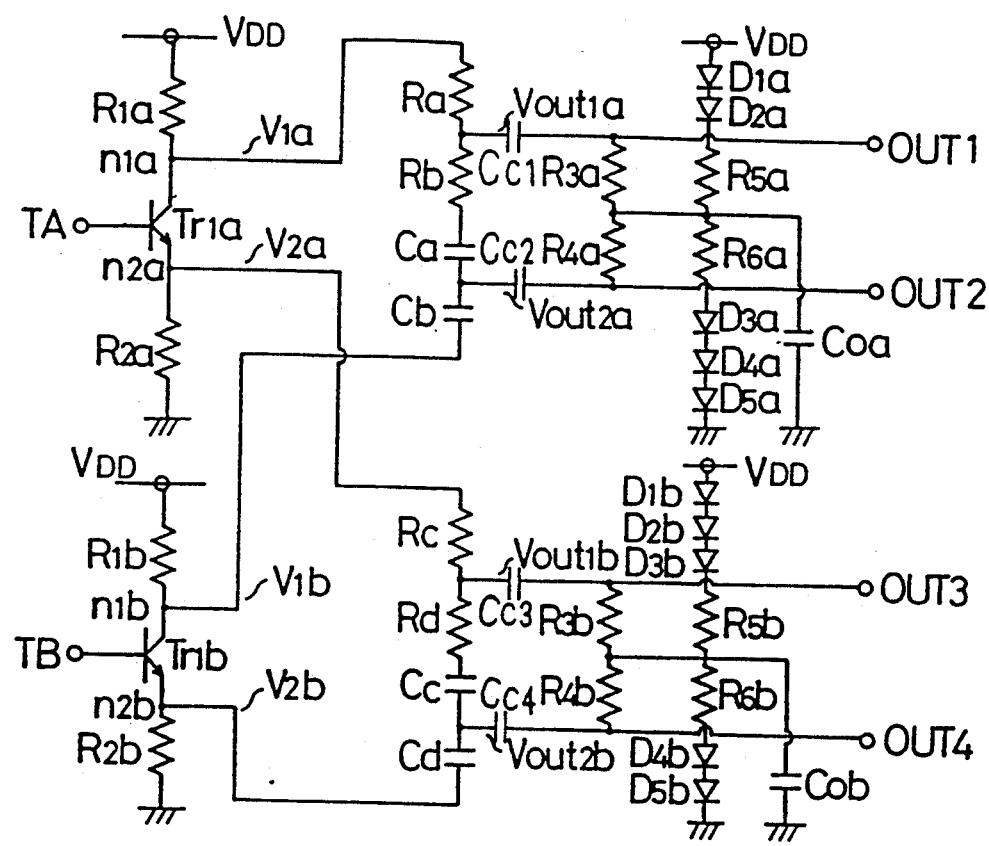
FIG. 20 is a schematic diagram of a phase shifter according to a sixteenth embodiment of the invention.
Figure 21:
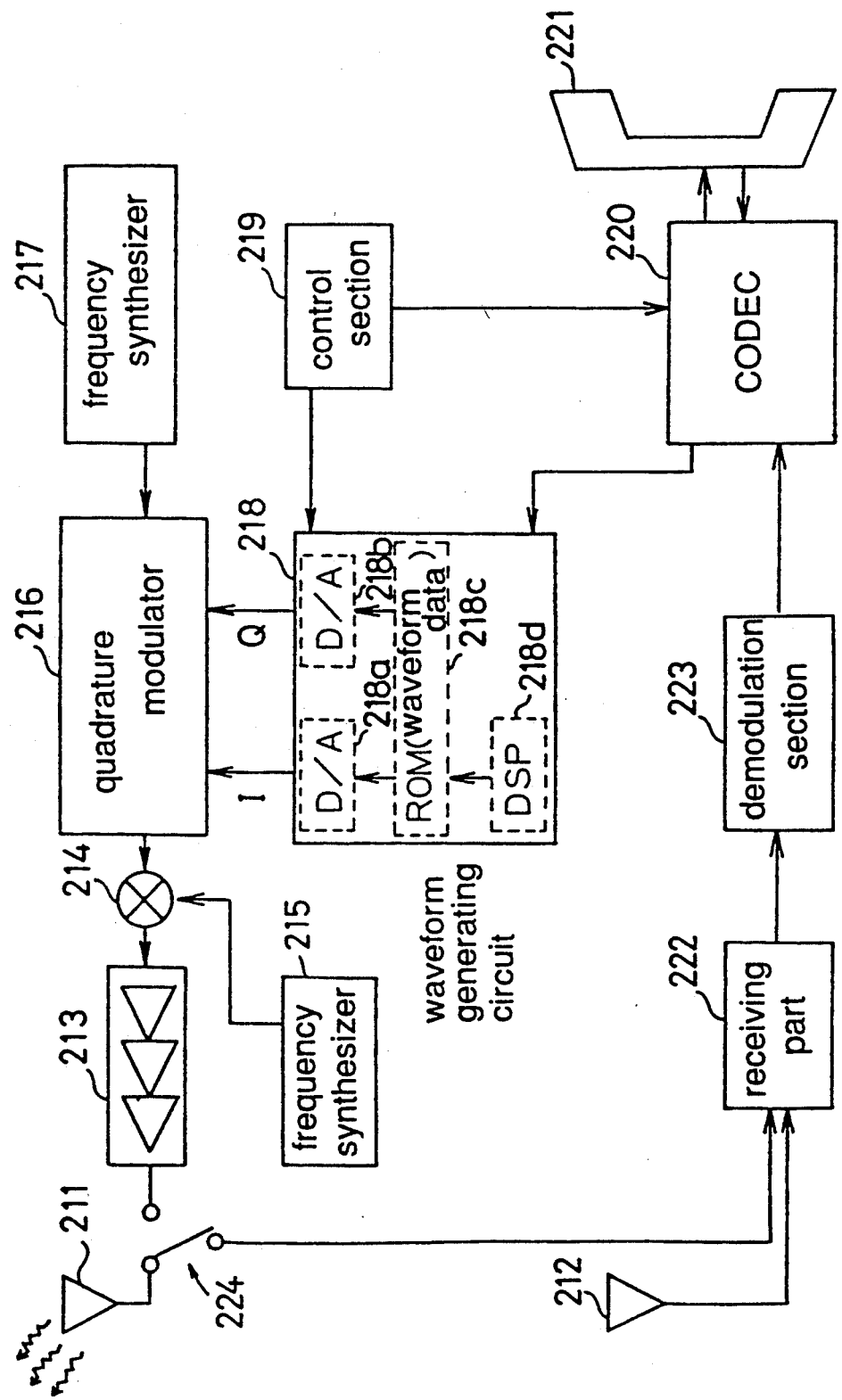
FIG. 21 is a block diagram of a portable telephone including a quadrature modulator.
Figure 22A:
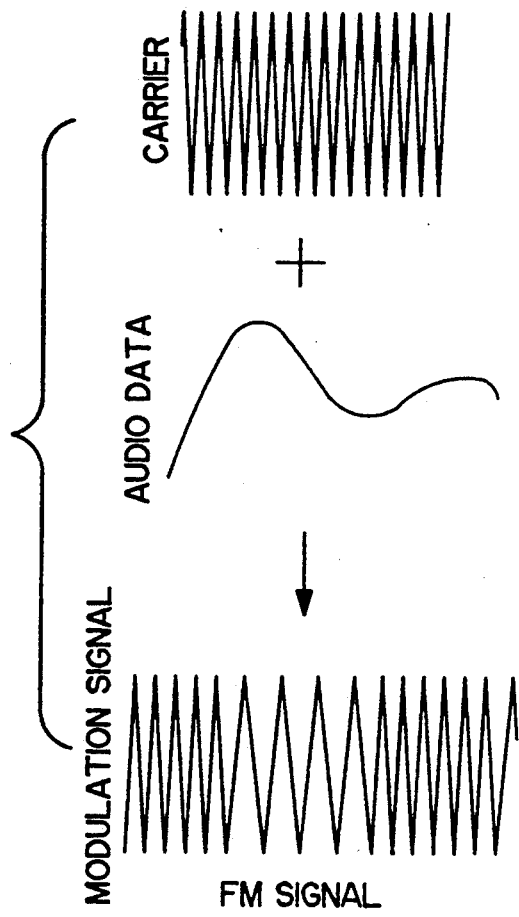
FIG. 22(a) illustrates an analog modulation system.
Figure 22B:
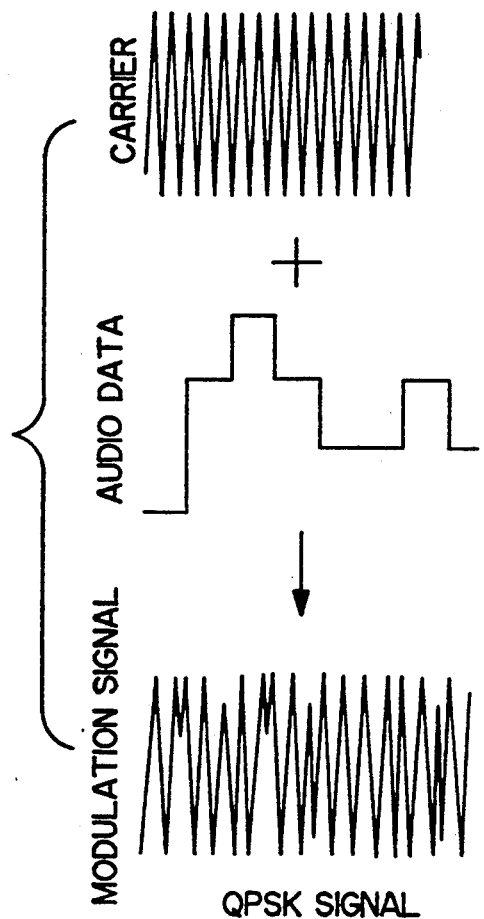
FIG. 22(b) illustrates a digital modulation system.
Figure 22C:
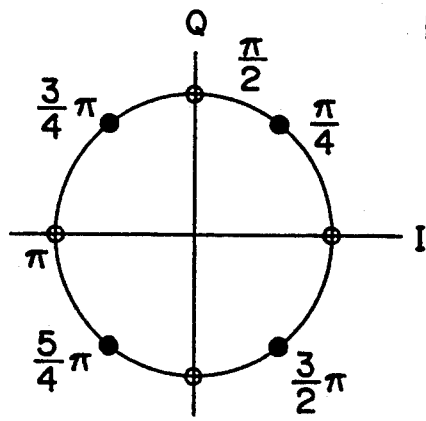
FIG. 22(c) illustrates a digital modulation system using a quadrature modulator, all according to the prior art.
Figure 23:
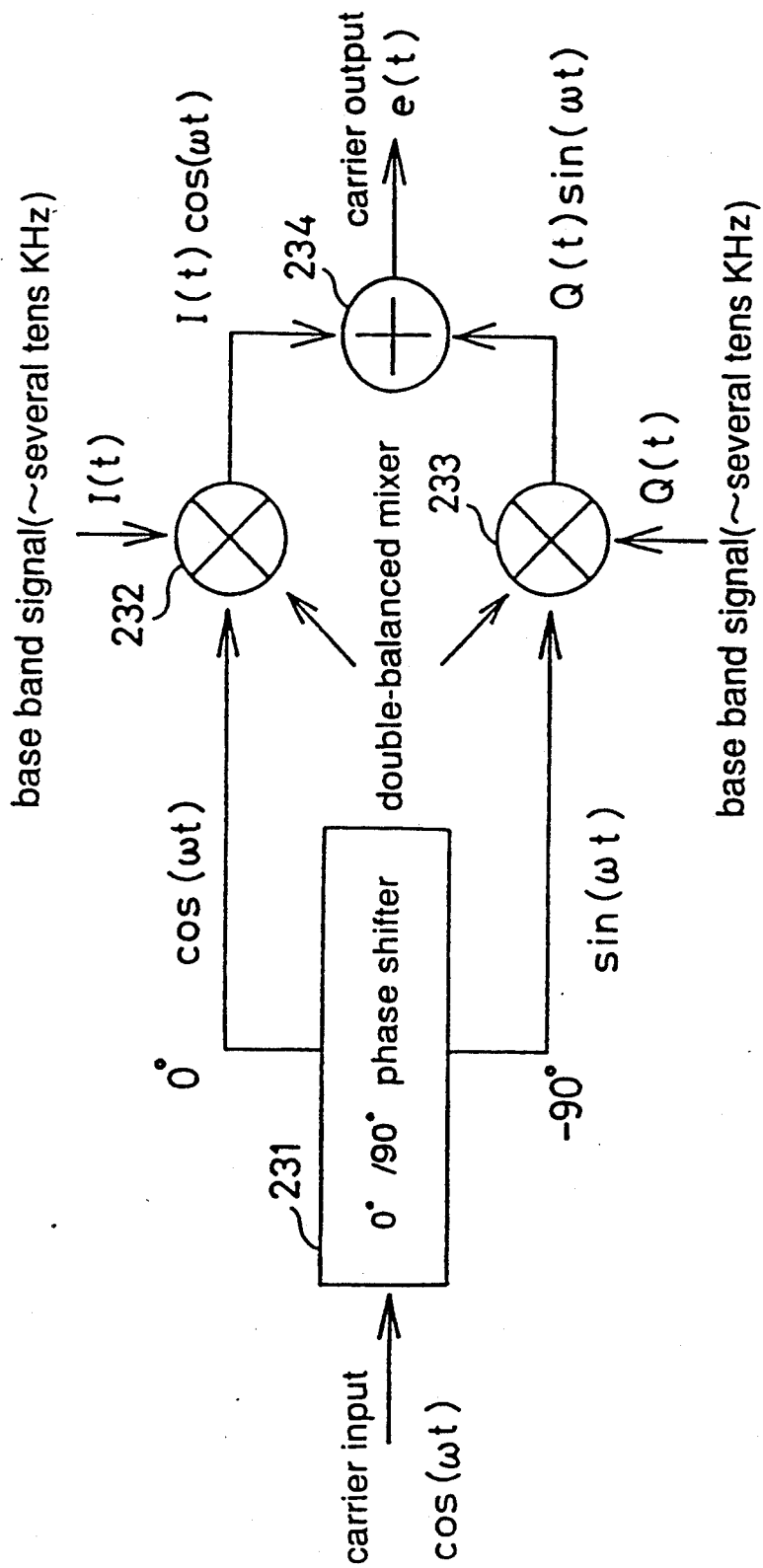
FIG. 23 is a diagram for explaining the operation of a quadrature modulator according to the prior art.
Figure 24:
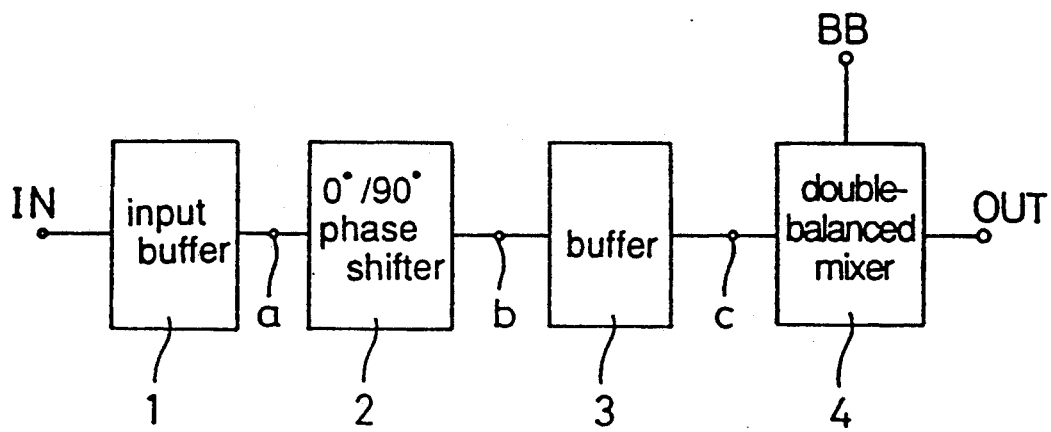
FIG. 24 is a block diagram of a quadrature modulator including a phase shifter according to the prior art.
Figure 25:
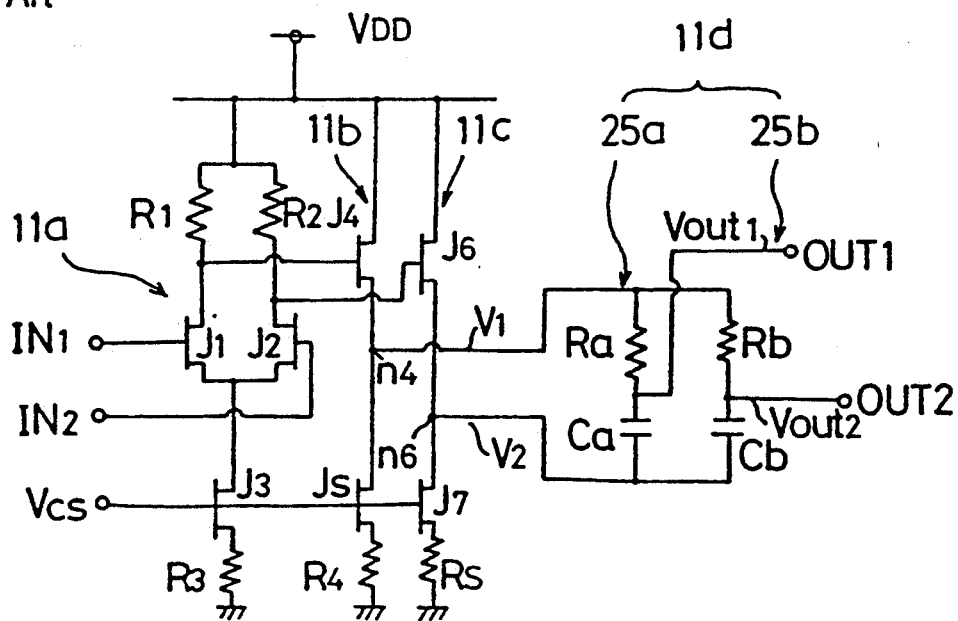
FIG. 25 is a schematic diagram of a phase shifter according to the prior art.
Figure 26:
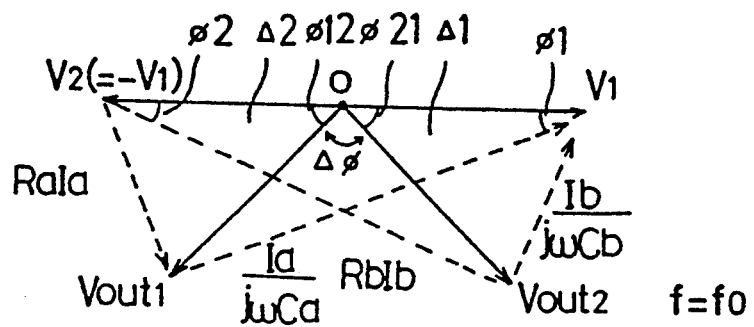
FIG. 26 is a vector diagram illustrating the operation of the phase shifter of FIG. 25.
Figure 27:
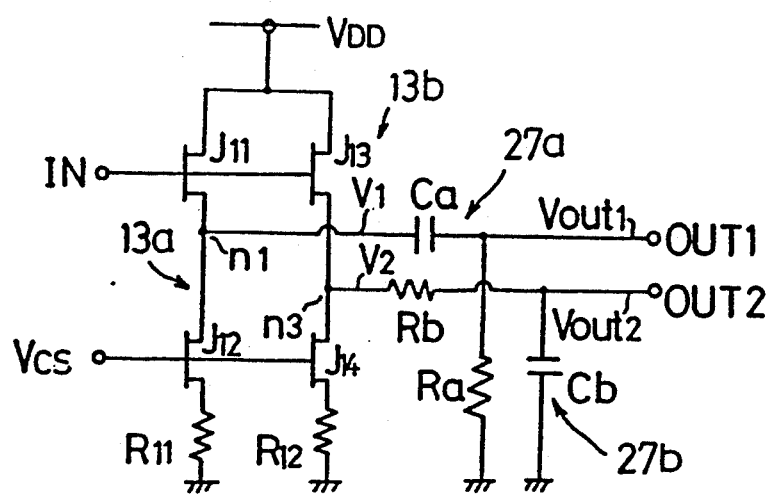
FIG. 27 is a schematic diagram of a phase shifter according to the prior art.
Figure 28:
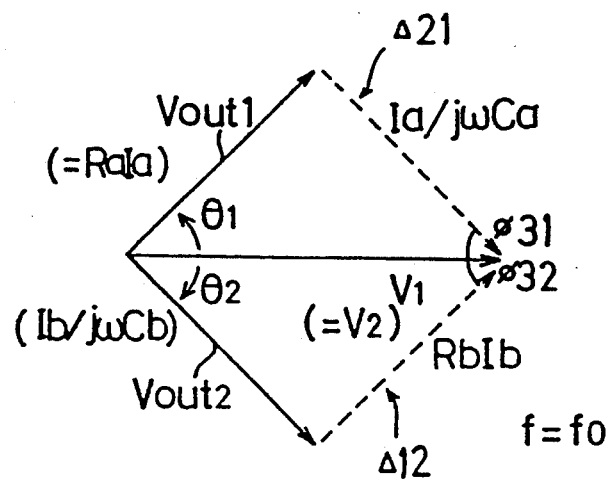
FIG. 28 is a vector diagram illustrating the operation of the phase shifter of FIG. 27.
Figure 29:
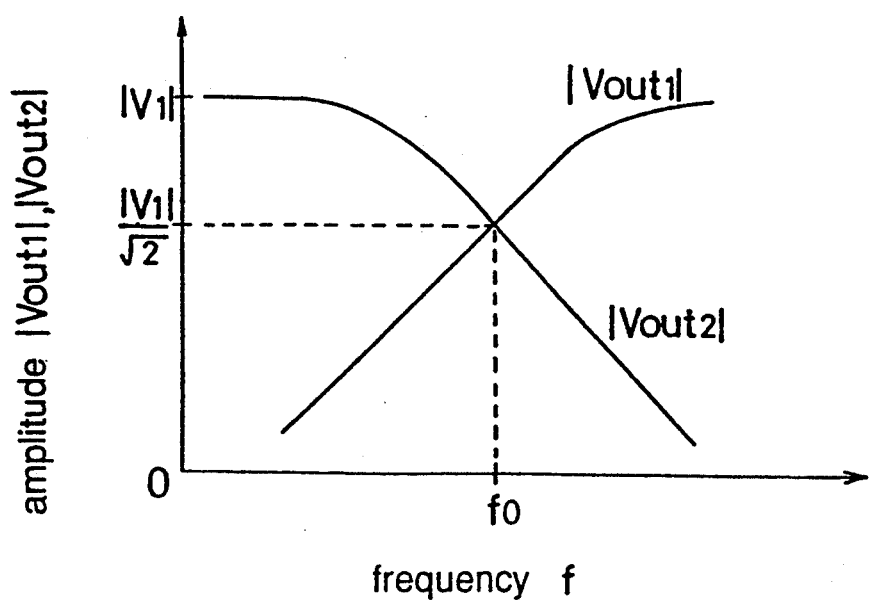
FIG. 29 is a graph of the amplitudes of input and output signal in the phase shifter of FIG. 27 as a function of frequency.
Figure 30:
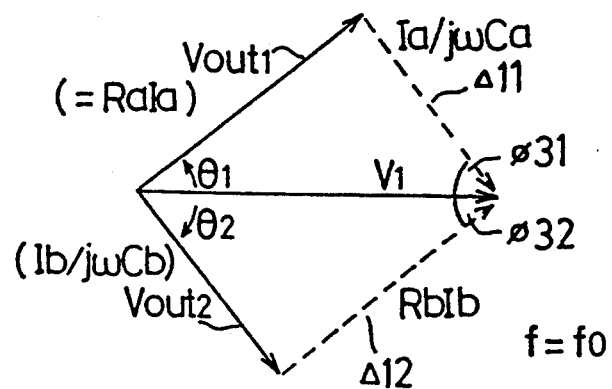
FIG. 30 is a vector diagram illustrating the performance of the phase shifter of FIG. 27 when element values vary.
Figure 31:
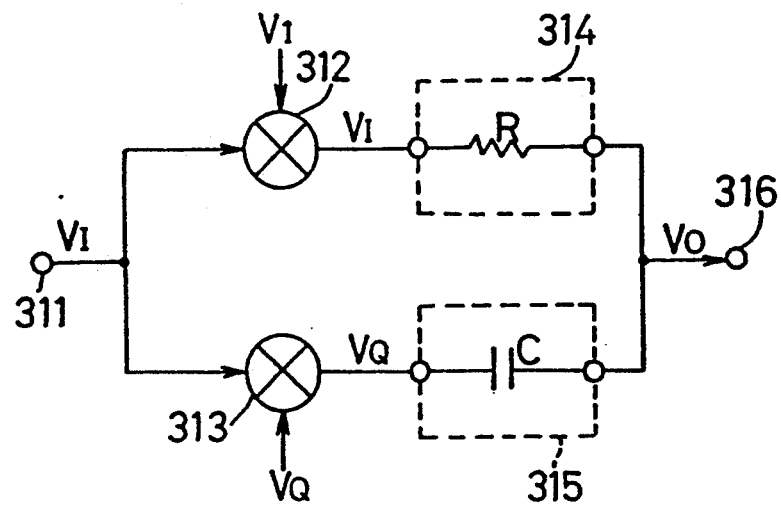
FIG. 31 is a schematic diagram of a quadrature modulator according to the prior art.
Figure 32:
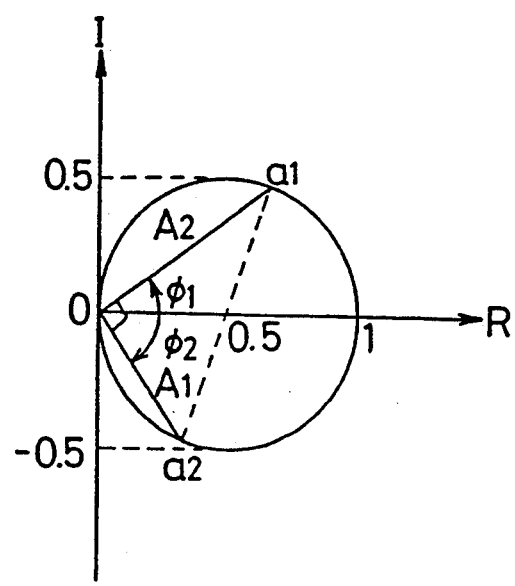
FIG. 32 is a phase diagram illustrating the performance of the quadrature modulator of FIG. 31.
Figure 33:
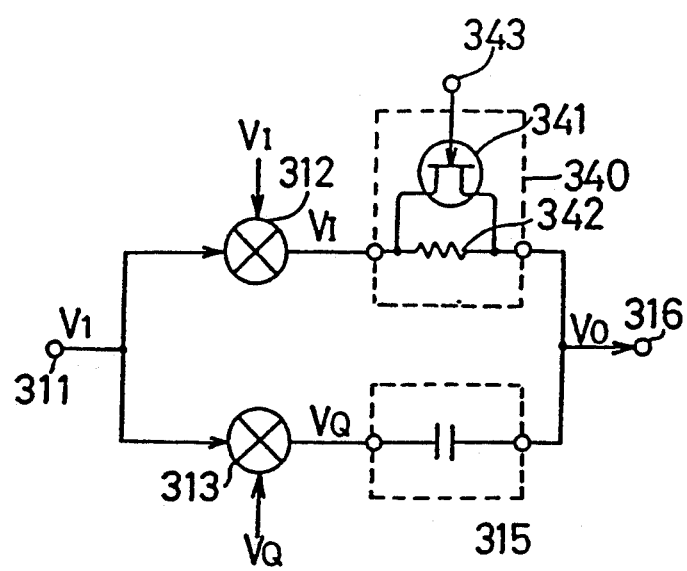
FIG. 33 is a schematic diagram of a phase shifter according to the prior art.
Figure 34:
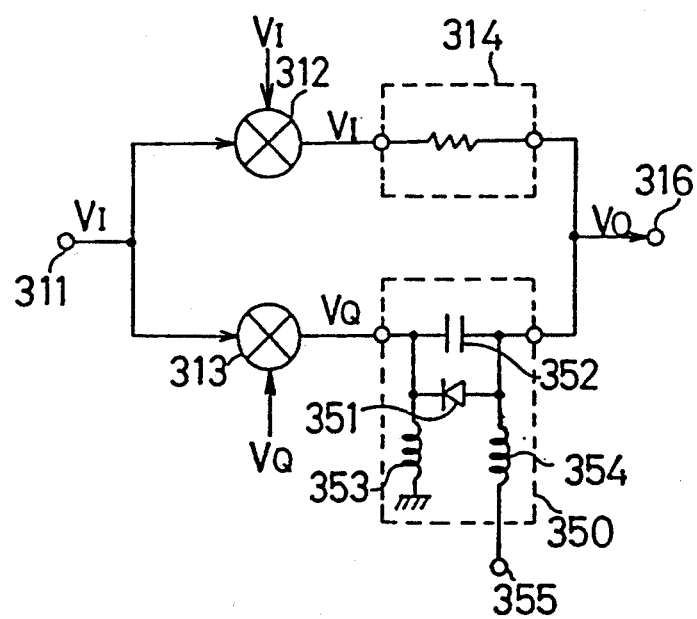
FIG. 34 is a schematic diagram of a phase shifter according to the prior art.
Figure 35A:
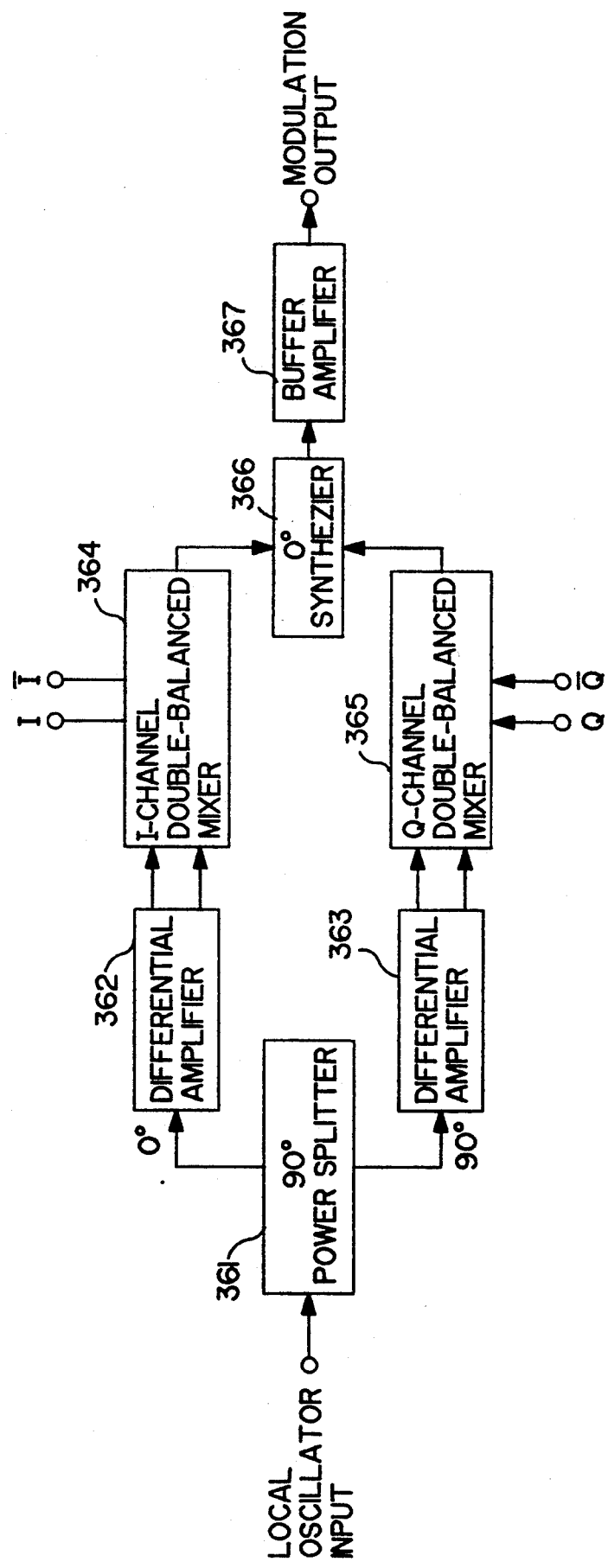
FIGS. 35(a) and 35(b) are block diagrams of quadrature modulators according to the prior art.
Figure 35B:
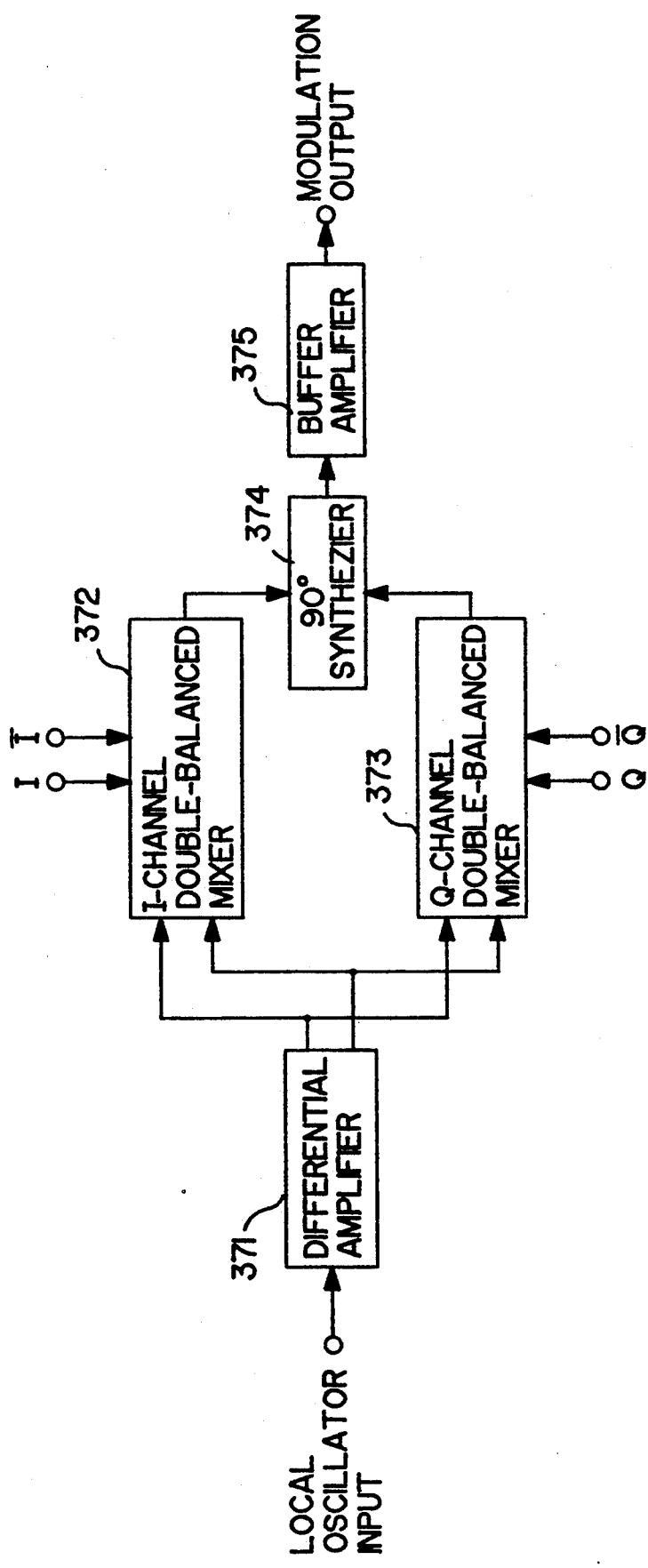
Figure 36:
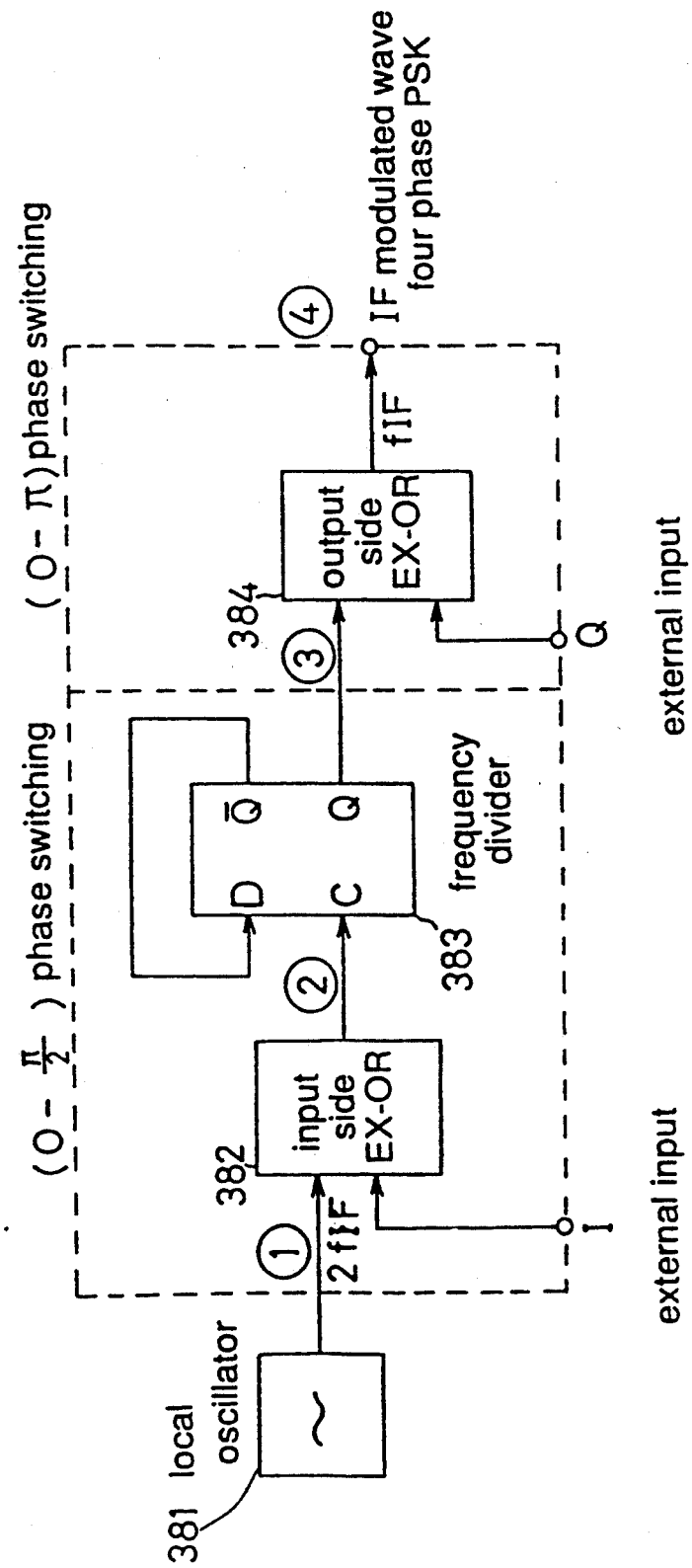
FIG. 36 is a block diagram of a modulator according to the prior art.
Figure 37A:
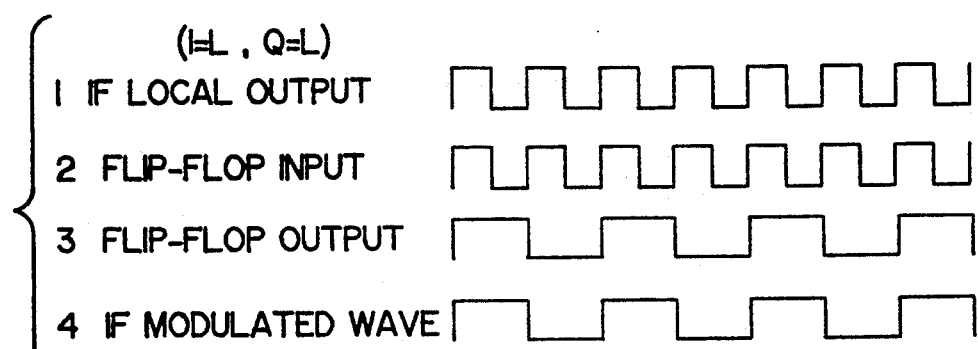
FIGS. 37(a)–37(d) illustrate signal amplitudes versus time in the operation of the modulator of FIG. 36.
Figure 37B:
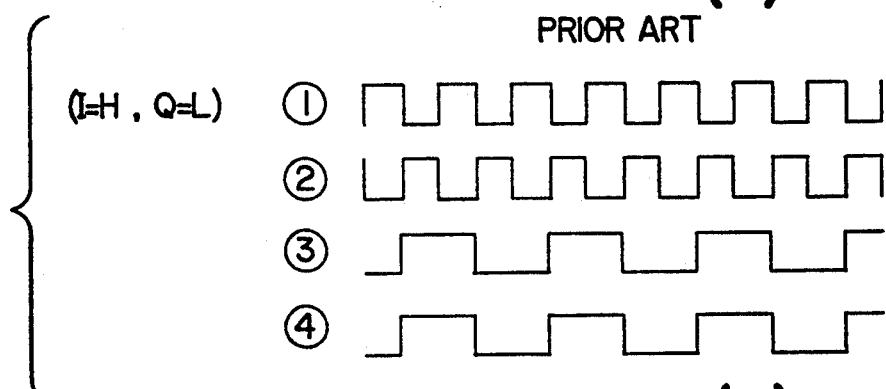
Figure 37C:
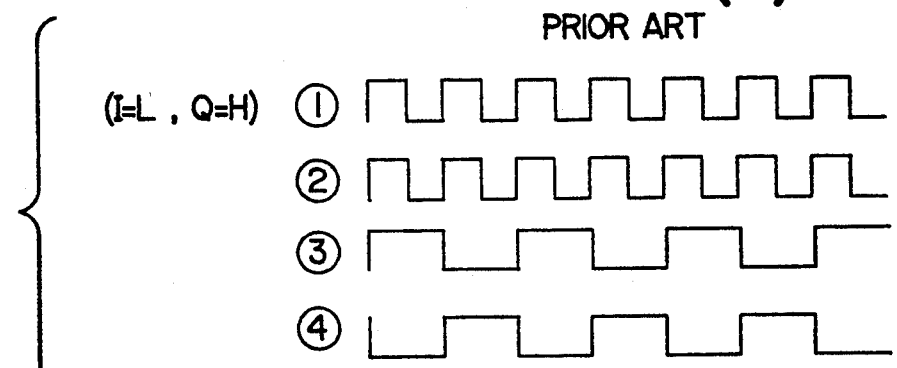
Figure 37D:
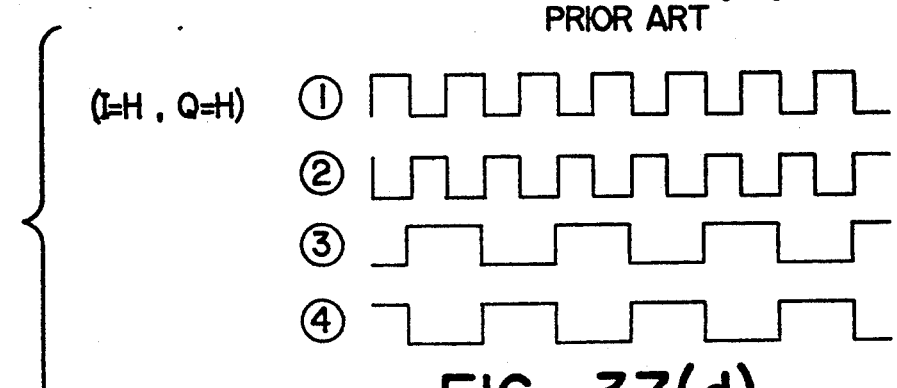

FIG. 20 shows a 0°/90°/180°/270° phase shifter according to a sixteenth embodiment of the present invention, and this embodiment is constituted by using npn type bipolar transistors Tr1a, Tr1b in place of the FETs J1a, and J1b of FIG. 18.

Embodiment 17

Also in this 0°/90°/180°/270° phase shifter, the set frequency can be made variable by a construction similar to FIG. 11, and for example, by providing FETs Ja, Jb connected in series between the resistors Ra and Rb, and FETs Jc, Jd between the resistors Rc and Rd, and controlling these FETs with separate control signals VG1, VG2.

Embodiment 18

Also in this 0°/90°/180°/270° phase shifter, the set frequency can be made variable by a construction similar to FIG. 12, and for example, by providing diodes VCa, VCb in parallel with the capacitors Ca and Cb, and providing diodes VCc, and VCd in parallel with the capacitors Cc and Cd, and controlling these diodes respectively by separate control signals VG2, VG4.

I claim:

1. A phase shifter receiving an input signal and producing two output signals having a 90° phase difference from each other comprising:

first and second input nodes for respectively receiving first and second input signals having opposite phases;

a first serial connection of a first resistor and a second resistor, connected at a resistor node, said first and second resistors having the same resistance values, a first end of said first serial connection being connected to said first input node;

a second serial connection of a first capacitor and a second capacitor, said first and second capacitors having the same capacitance values and being connected at a capacitor node, said second serial connection being connected to the second end of said first serial connection and said second input node; and first and second output nodes respectively connected to the resistor node and the capacitor node, producing output signals having a 90° phase difference from each other.

2. The phase shifter of claim 1 wherein said first and second resistors comprise variable resistors whereby a center frequency of the phase shifter is variable.

3. The phase shifter of claim 2 wherein said variable resistors comprise two field effect transistors (FETs) connected in series at the resistor node between and to said first and second resistors, the resistances of said field effect transistors being varied by voltages applied across gate electrodes of said FETs and commonly connected electrodes of said FETs.

4. The phase shifter of claim 1 wherein said first capacitor and said second capacitor comprise variable capacitors whereby a center frequency of the phase shifter is variable.

5. The phase shifter of claim 4 wherein said variable capacitors comprise first and second diodes respectively connected in parallel with said first capacitor and said second capacitor and connected in series in reverse polarity to the capacitor node, the capacitances of said diodes being varied by voltages applied across said first and second diodes.

6. A phase shifter receiving an input signal and producing four output signals having sequential 90° phase differences from each other comprising:

first and second input nodes for respectively receiving first and second input signals having opposite phases;

third and fourth input nodes for respectively receiving third and fourth input signals respectively having the same phases as the second and first input signals applied to said second and first input nodes;

a first serial connection of a first resistor and a second resistor, said first and second resistors having the same resistance values and being connected at a first resistor node, a first end of said first serial connection being connected to said first input node;

a second serial connection of a first capacitor and a second capacitor, said first and second capacitors having the same capacitance values and being connected at a first capacitor node, said second serial connecting being connected between the a second end of said first serial connection and said third input node;

a third serial connection of a third resistor and a fourth resistor, said third and fourth resistors having the same resistance values and being connected at a second resistor node, a first end of said third serial connection being connected to said second input node;

a fourth serial connection of a third capacitor and a fourth capacitor, said third and fourth capacitors having the said capacitance values and being connected at a second capacitor node, said fourth serial connection being connected between the a second end of said third serial connection and said fourth input node;

first, second, third, and fourth output nodes respectively connected to the first resistor node, the first capacitor node, the second resistor node, and the second capacitor node to produce output signals having sequential 90° phase differences.

7. The phase shifter of claim 6 wherein said first, second, third, and fourth resistors comprise variable resistors whereby a center frequency of the phase shifter is variable.

8. The phase shifter of claim 7 wherein said variable resistors comprise two field effect transistors (FETs) connected in series at the first resistor node between and to said first and second resistors, the resistances of said field effect transistors being varied by voltages applied across gate electrodes of said first and second FETs and commonly connected electrodes of said FETs, and third and fourth field effect transistors (FETs) connected in series at the second resistor node between and to said third and fourth resistors, the resistances of said third and fourth field effect transistors being varied by voltages applied across gate electrodes of said third and fourth FETs and commonly connected electrodes of said FETs.

9. The phase shifter of claim 6 wherein said first capacitor, said second capacitor, said third capacitor, and said fourth capacitor each comprise variable capacitors whereby a center frequency of the phase shifter is variable.

10. The phase shifter of claim 9 wherein said variable capacitors comprise first and second diodes connected in parallel with said first capacitor and said second capacitor, respectively, and connected in series at the first capacitor node in reverse polarity, the capacitances of said first and second diodes being varied by voltages applied across said first and second diodes, and third and fourth diodes connected in parallel with said third capacitor and said fourth capacitor, respectively, and connected in series at the second capacitor node in reverse polarity, the capacitances of said third and fourth diodes being varied by voltages applied across said third and fourth diodes.

* * * * *

UNITED STATES PATENT AND TRADEMARK OFFICE
CERTIFICATE OF CORRECTION

PATENT NO. : 5,317,276

DATED : May 31, 1994

INVENTOR(S) : Yamamoto

It is certified that error appears in the above-indentified patent and that said Letters Patent is hereby corrected as shown below:

Column 23, line 35, change "said" to --same--.

Signed and Sealed this

Twenty-seventh Day of September, 1994

Attest:

BRUCE LEHMAN

*Attesting Officer*     *Commissioner of Patents and Trademarks*